(12) United States Patent
Koezuka et al.

(10) Patent No.: US 9,780,226 B2
(45) Date of Patent: Oct. 3, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Junichi Koezuka, Tochigi (JP); Yukinori Shima, Gunma (JP); Masami Jintyou, Tochigi (JP); Yasutaka Nakazawa, Tochigi (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/685,737

(22) Filed: Apr. 14, 2015

(65) Prior Publication Data
US 2015/0311346 A1    Oct. 29, 2015

(30) Foreign Application Priority Data

Apr. 25, 2014    (JP) .................... 2014-091703

(51) Int. Cl.
H01L 29/786 (2006.01)
H01L 29/66 (2006.01)
H01L 29/423 (2006.01)

(52) U.S. Cl.
CPC .... H01L 29/7869 (2013.01); H01L 29/42384 (2013.01); H01L 29/66969 (2013.01);
(Continued)

(58) Field of Classification Search
CPC .............. H01L 29/7869; H01L 29/78696
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — David Vu
(74) *Attorney, Agent, or Firm* — Nixon Peabody LLP; Jeffrey L. Costellia

(57) ABSTRACT

Provided is a transistor with small parasitic capacitance or high frequency characteristics or a semiconductor device including the transistor. An oxide semiconductor film includes a first region in contact with a first conductive film, a second region in contact with a first insulating film, a third region in contact with a third insulating film, a fourth region in contact with a second insulating film, and a fifth region in contact with a second conductive film. The first insulating film is positioned over the first conductive film and the oxide semiconductor film. The second insulating film is positioned over the second conductive film and the oxide semiconductor film. The third insulating film is positioned over the first insulating film, the second insulating film, and the oxide semiconductor film. The third conductive film and the oxide semiconductor film partly overlap with each other with the third insulating film provided therebetween.

15 Claims, 23 Drawing Sheets

(52) U.S. Cl.
CPC .. *H01L 29/78606* (2013.01); *H01L 29/78648* (2013.01); *H01L 29/78696* (2013.01); *H01L 2029/42388* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,410,002 B2 | 4/2013 | Yamazaki et al. |
| 8,501,564 B2 | 8/2013 | Suzawa et al. |
| 8,547,771 B2 | 10/2013 | Koyama |
| 9,012,994 B2 * | 4/2015 | Jung .................. H01L 27/1225 257/347 |
| 9,171,803 B2 | 10/2015 | Koezuka et al. |
| 9,331,207 B2 | 5/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0002312 A1* | 1/2013 | Yamazaki .............. G11C 19/28 327/109 |
| 2014/0306217 A1 | 10/2014 | Yamazaki et al. |
| 2014/0339538 A1 | 11/2014 | Yamazaki et al. |
| 2014/0339539 A1 | 11/2014 | Yamazaki et al. |
| 2014/0339544 A1 | 11/2014 | Hanaoka et al. |
| 2014/0339547 A1 | 11/2014 | Hondo et al. |
| 2014/0339548 A1 | 11/2014 | Yamazaki et al. |
| 2014/0340608 A1 | 11/2014 | Yamazaki et al. |
| 2014/0361289 A1 | 12/2014 | Suzawa |
| 2014/0361290 A1 | 12/2014 | Yamazaki et al. |
| 2014/0361292 A1 | 12/2014 | Yamazaki et al. |
| 2014/0361293 A1 | 12/2014 | Yamazaki et al. |
| 2014/0362324 A1 | 12/2014 | Yamazaki et al. |
| 2014/0374744 A1 | 12/2014 | Matsukura et al. |
| 2015/0014679 A1 | 1/2015 | Sasagawa et al. |
| 2015/0021596 A1 | 1/2015 | Yamazaki et al. |
| 2015/0028330 A1 | 1/2015 | Yamazaki et al. |
| 2015/0034949 A1 | 2/2015 | Yamazaki |
| 2015/0069384 A1 | 3/2015 | Kobayashi et al. |
| 2015/0077162 A1 | 3/2015 | Yamazaki et al. |
| 2015/0194535 A1 | 7/2015 | Yamazaki et al. |
| 2015/0270402 A1 | 9/2015 | Endo et al. |
| 2015/0280013 A1 | 10/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2012-257187 | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure For Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al "World's Largest (15-Inch) XGA AMLCD Panel Using IGZO Oxide TFT", SID Digest '08 ; SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; η=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09: SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M at al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 3A
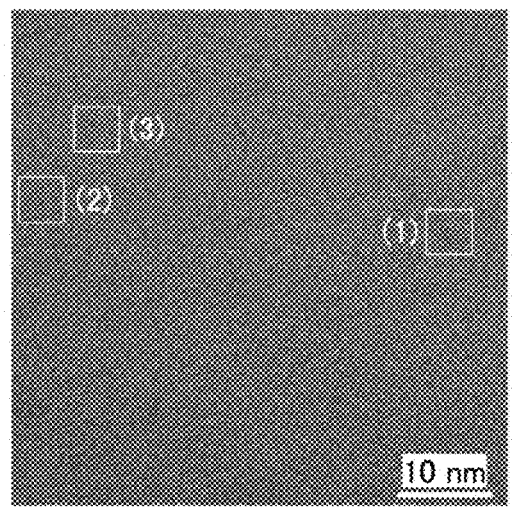
FIG. 3B          FIG. 3C          FIG. 3D
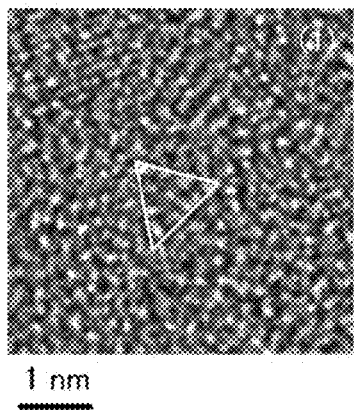 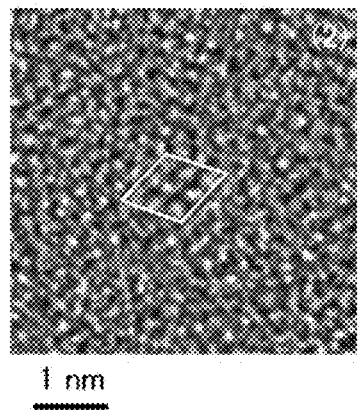 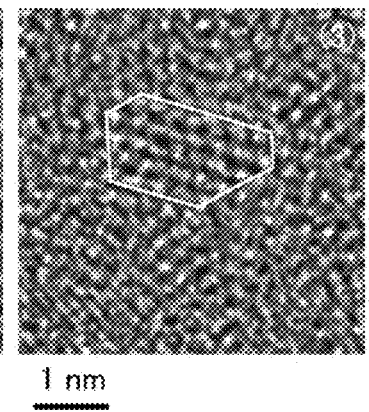

FIG. 5A
FIG. 5B
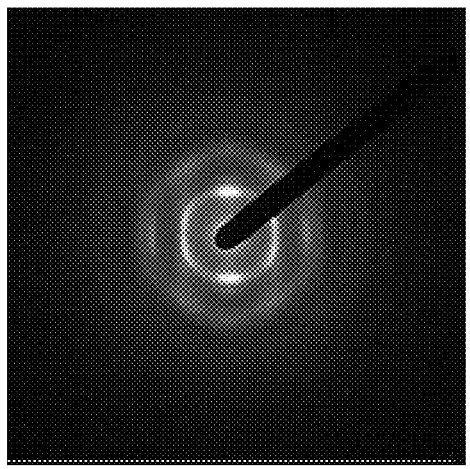
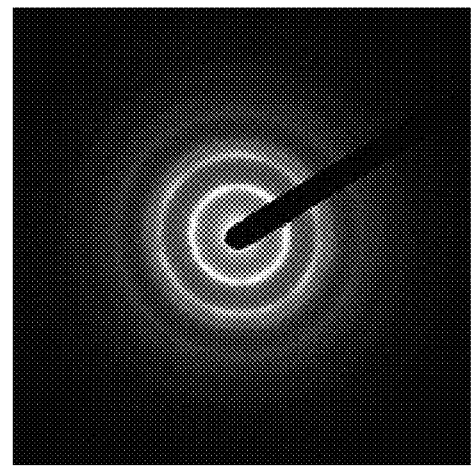

SEMICONDUCTOR DEVICE AND MANUFACTURING METHOD THEREOF

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

In recent years, a transistor including an oxide semiconductor has attracted attention. An oxide semiconductor can be formed by a sputtering method or the like, and thus can be used for a semiconductor of a transistor in a large display device. In addition, a transistor including an oxide semiconductor has an advantage that capital investment can be reduced because part of production equipment for a transistor including amorphous silicon can be retrofitted and utilized.

It is known that a transistor including an oxide semiconductor has an extremely low leakage current in an off state. For example, a low-power-consumption CPU utilizing the low leakage current of the transistor including an oxide semiconductor is disclosed (see Patent Document 1).

REFERENCE

Patent Document

[Patent Document 1] Japanese Published Patent Application No. 2012-257187

SUMMARY OF THE INVENTION

An object is to provide a semiconductor device with small parasitic capacitance. Another object is to provide a semiconductor device with favorable or stable electrical characteristics. Another object is to provide a semiconductor device with low off-state current. Another object is to provide a novel semiconductor device. Another object is to provide a semiconductor device which can operate at high speed. Another object is to provide a module including the semiconductor device. Another object is to provide an electronic device including the semiconductor device or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an oxide semiconductor film, a first conductive film, a second conductive film, a third conductive film, a first insulating film, a second insulating film, and a third insulating film. The oxide semiconductor film includes a first region, a second region, a third region, a fourth region, and a fifth region. The first region includes a region where the first conductive film is in contact with the oxide semiconductor film. The second region includes a region where the first insulating film is in contact with the oxide semiconductor film. The third region includes a region where the third insulating film is in contact with the oxide semiconductor film. The fourth region includes a region where the second insulating film is in contact with the oxide semiconductor film. The fifth region includes a region where the second conductive film is in contact with the oxide semiconductor film. The first insulating film is positioned over the first conductive film and the oxide semiconductor film. The second insulating film is positioned over the second conductive film and the oxide semiconductor film. The third insulating film is positioned over the first insulating film, the second insulating film, and the oxide semiconductor film. The third conductive film and the oxide semiconductor film partly overlap with each other with the third insulating film provided therebetween.

Another embodiment of the present invention is a semiconductor device including an oxide semiconductor film, a first conductive film, a second conductive film, a third conductive film, a fourth conductive film, a first insulating film, a second insulating film, a third insulating film, and a fourth insulating film. The fourth insulating film is positioned over the fourth conductive film. The oxide semiconductor film is positioned over the fourth insulating film. The oxide semiconductor film includes a first region, a second region, a third region, a fourth region, and a fifth region. The first region includes a region where the first conductive film is in contact with the oxide semiconductor film. The second region includes a region where the first insulating film is in contact with the oxide semiconductor film. The third region includes a region where the third insulating film is in contact with the oxide semiconductor film. The fourth region includes a region where the second insulating film is in contact with the oxide semiconductor film. The fifth region includes a region where the second conductive film is in contact with the oxide semiconductor film. The first insulating film is positioned over the first conductive film and the oxide semiconductor film. The second insulating film is positioned over the second conductive film and the oxide semiconductor film. The third insulating film is positioned over the first insulating film, the second insulating film, and the oxide semiconductor film. The third conductive film and the oxide semiconductor film partly overlap with each other with the third insulating film provided therebetween.

In the structure, the first insulating film and the second insulating film may contain hydrogen. The second region may include a region having a lower resistance than the third region. The fourth region may include a region having a lower resistance than the third region.

In the structure, the oxide semiconductor film may include a first oxide semiconductor film, a second oxide semiconductor film, and a third oxide semiconductor film.

The first oxide semiconductor film, the second oxide semiconductor film, and the third oxide semiconductor film may partly overlap with one another.

Another embodiment of the present invention is an electronic device including the semiconductor device.

Another embodiment of the present invention is a manufacturing method of a semiconductor device including a first step of forming an oxide semiconductor film, a second step of forming a first conductive film and a second conductive film over the oxide semiconductor film, a third step of forming a first insulating film over the oxide semiconductor film, the first conductive film, and the second conductive film, a fourth step of forming a second insulating film and a third insulating film by processing the first insulating film so that the oxide semiconductor film is partly exposed, a fifth step of forming a fourth insulating film over the oxide semiconductor film, the second insulating film, and the third insulating film, and a sixth step of forming a third conductive film overlapping the oxide semiconductor film, over the fourth insulating film.

Another embodiment of the present invention is a manufacturing method of a semiconductor device including a first step of forming an oxide semiconductor film, a second step of forming a first conductive film and a second conductive film over the oxide semiconductor film, a third step of forming a first insulating film and a second insulating film by oxidizing or nitriding the first conductive film and the second conductive film, a fourth step of forming a third insulating film over the oxide semiconductor film, the first insulating film, and the second insulating film, and a fifth step of forming a third conductive film overlapping the oxide semiconductor film, over the third insulating film.

Note that the oxide semiconductor film in any of the semiconductor devices of the embodiments of the present invention may be replaced with another semiconductor film.

A semiconductor device with small parasitic capacitance can be provided. A semiconductor device with favorable or stable electrical characteristics can be provided. A semiconductor device with low off-state current can be provided. A novel semiconductor device can be provided. A semiconductor device which can operate at high speed can be provided. A module including the semiconductor device can be provided. An electronic device including the semiconductor device or the module can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 3A to 3D are Cs-corrected high-resolution TEM images of a plane of a CAAC-OS.

FIGS. 5A and 5B show electron diffraction patterns of a CAAC-OS.

DETAILED DESCRIPTION OF THE INVENTION

Figure 1A:
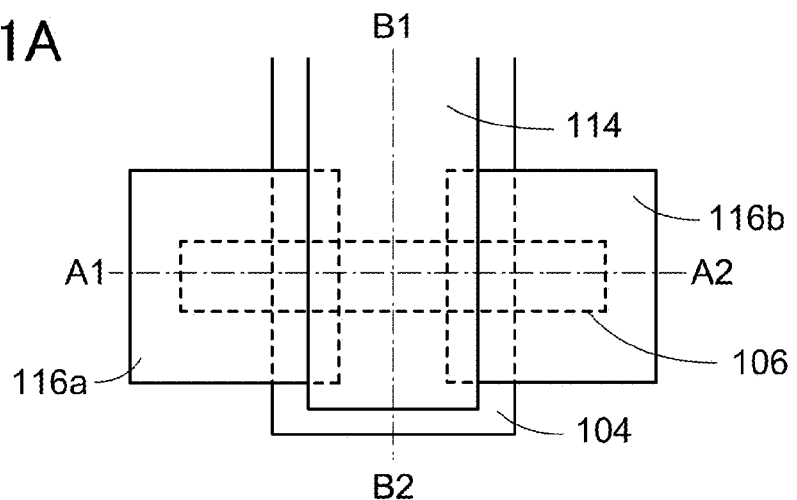
FIGS. 1A to 1C are a top view and cross-sectional views of a transistor.

Hereinafter, embodiment of the present invention will be described in detail with the reference to the drawings. However, the present invention is not limited to the description below, and it is easily understood by those skilled in the art that modes and details can be changed variously. The present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a voltage refers to a potential difference between a certain potential and a reference potential (e.g., a ground potential (GND) or a source potential) in many cases. A voltage can be referred to as a potential and vice versa.

Note that the ordinal numbers such as "first" and "second" in this specification are used for convenience and do not denote the order of steps or the stacking order of layers. Therefore, for example, description can be made even when "first" is replaced with "second" or "third", as appropriate.

In addition, the ordinal numbers in this specification and the like are not necessarily the same as those which specify one embodiment of the present invention.

Note that a "semiconductor (or semiconductor film)" includes characteristics of an "insulator (or insulating film)" in some cases when the conductivity is sufficiently low, for example. A "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor (or semiconductor film)" includes characteristics of a "conductor (or conductive film)" in some cases when the conductivity is sufficiently high, for example. A "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, the case where the concentration of the whole of a region of A in the depth direction is B, the case where the average concentration in a region of A in the depth direction is B, the case where the median value of a concentration in a region of A in the depth direction is B, the case where the maximum value of a concentration in a region of A in the depth direction is B, the case where the minimum value of a concentration in a region of A in the depth direction is B, the case where a convergence value of a concentration in a region of A in the depth direction is B, and the case where a concentration in a region in which a probable value of A is obtained in measurement is B.

In this specification, the phrase "A has a region with a size B, a length B, a thickness B, a width B, or a distance B" includes, for example, "the size, the length, the thickness, the width, or the distance of the entire region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region in which a probable value is obtained in measurement is B".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. In a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be alternately referred to as the description "one of end portions of A is positioned on an outer side than one of end portions of B".

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to −85° and less than or equal to 100°. A term "substantially perpendicular" indicates that the angle formed between two straight lines is greater than or equal to 60° and less than or equal to 120°.

In this specification, trigonal and rhombohedral crystal systems are included in a hexagonal crystal system.
(Embodiment 1)

In this embodiment, a semiconductor device of one embodiment of the present invention and a method for manufacturing the semiconductor device will be described with reference to drawings. Transistors are used as an example of the semiconductor device.
<Transistor Structure 1>

Figure 1B:
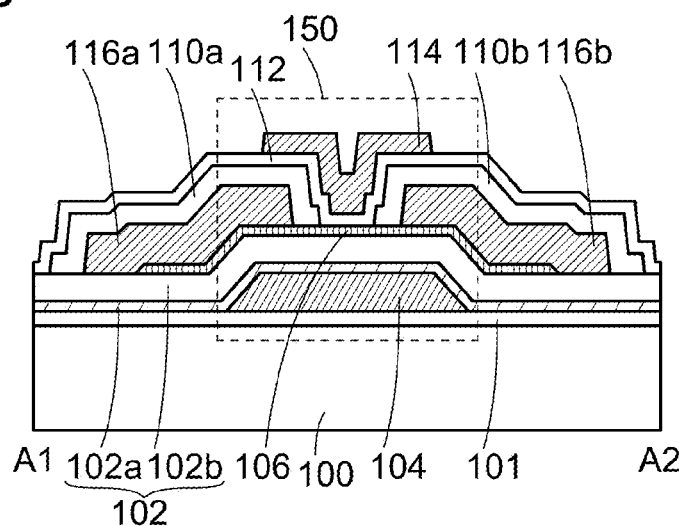
Figure 1C:
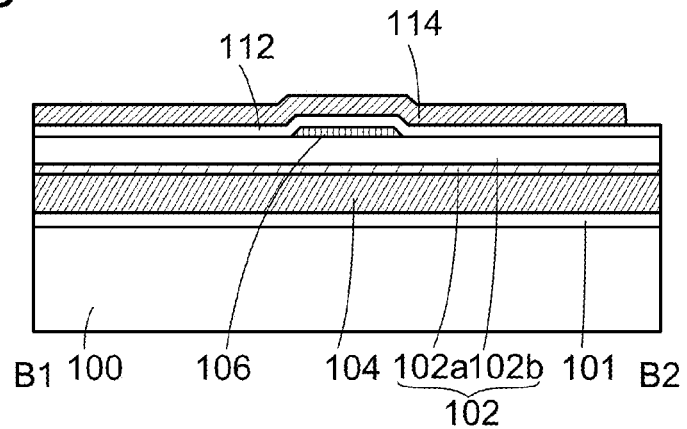

FIGS. 1A to 1C are a top view and cross-sectional views of a transistor 150 of one embodiment of the present invention. FIG. 1A is the top view. FIGS. 1B and 1C are the cross-sectional views taken along dashed-dotted line A1-A2 and dashed-dotted line B1-B2 in FIG. 1A. Note that some components in the top view in FIG. 1A are not illustrated for simplification of the drawing.

The transistor 150 in FIG. 1B includes an insulating film 101 over a substrate 100, a conductive film 104 over the insulating film 101, an insulating film 102 over the conductive film 104, a semiconductor film 106 over the insulating film 102, a conductive film 116a and a conductive film 116b each including a region in contact with a top surface and a side surface of the semiconductor film 106, an insulating film 110a over the semiconductor film 106 in contact with a top surface and side surfaces of the conductive film 116a, an insulating film 110b over the semiconductor film 106 in contact with a top surface and side surfaces of the conductive film 116b, an insulating film 112 over the insulating film 110a, the insulating film 110b, and the semiconductor film 106, and a conductive film 114 over the insulating film 112. Part of the conductive film 114 overlaps the semiconductor film 106.

Note that the transistor 150 does not necessarily include the insulating film 101.

The insulating film 101 functions as a base insulating film in the transistor 150. The conductive film 104 functions as a gate electrode. The insulating film 102 functions as a gate insulating film. The conductive films 116a and 116b function as a source electrode and a drain electrode. The insulating film 112 functions as a gate insulating film. The conductive film 114 functions as a gate electrode. The operation of the transistor 150 can be controlled using potentials applied to the conductive film 104 or 114. In other words, the conduction between the conductive films 116a and 116b can be controlled in accordance with the potential applied to the conductive film 104 or 114.

The semiconductor film 106 in the transistor 150 includes a region in contact with the conductive film 116a, a region in contact with the insulating film 110a, a region in contact with the insulating film 112, a region in contact with the insulating film 110b, and a region in contact with the conductive film 116b. Because the transistor 150 includes the insulating films 110a, 110b, and 112 between the conductive films 114 and 116a and between the conductive films 114 and 116b, the total thickness of the insulating films is large. As a result, parasitic capacitance involved in operation of the transistor 150 can be reduced.

As shown in FIG. 1B, the side surfaces of the semiconductor film 106 are in contact with the conductive films 116a and 116b. Further, the semiconductor film 106 can be electrically surrounded by an electric field of the conductive film 114 functioning as a gate electrode. A structure in which a semiconductor film is electrically surrounded by an electric field of a gate electrode is referred to as a surrounded channel (s-channel) structure. Therefore, a channel is formed in the entire semiconductor film 106 (bulk) in some cases. In the s-channel structure, a large amount of current can flow between a source and a drain of a transistor, so that current in a conduction state (on-state current) can be high. Because the semiconductor film 106 is surrounded by an electric field of the conductive film 114, current in a non-conduction state (off-state current) can be low.

Note that the transistor 150 may be surrounded by an insulating film having a function of blocking oxygen and impurities such as hydrogen in order to stabilize electric characteristics of the transistor 150. For example, an insulating film having a function of blocking oxygen and impurities such as hydrogen may be used as the insulating film 101.

As the insulating film having a function of blocking oxygen and impurities such as hydrogen, for example, an insulating film with a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used.

The insulating film 101 may be formed using, for example, aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulating film 101 preferably contains aluminum oxide or silicon nitride. When the insulating film 101 contains aluminum oxide or silicon nitride, entry of impurities such as hydrogen to the semiconductor film 106 is prevented, for example. In addition, when the insulating film 101 contains aluminum oxide or silicon oxide, out-diffusion of oxygen can be reduced.

The insulating film 101 may have a function of preventing diffusion of impurities from the substrate 100.

The conductive film 104 may be formed to have, for example, a single-layer structure or a stacked-layer structure including a conductive film containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film containing these elements may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used.

The conductive film 104 functions as a second gate electrode (also referred to as a backgate electrode) of the transistor 150. For example, by applying a lower voltage or a higher voltage than the source electrode to the conductive film 104, the threshold voltage of the transistor 150 may be shifted in the positive direction or the negative direction. For example, by shifting the threshold voltage of the transistor 150 in the positive direction, a normally-off transistor in which the transistor 150 is in a non-conduction state (off state) even when the gate voltage is 0 V can be achieved in some cases. Note that the voltage applied to the conductive film 104 may be variable or fixed.

The insulating film 102 may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 102 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. As the insulating film 102 in this embodiment, an insulating film 102a and an insulating film 102b are formed from the substrate 100 side. The insulating film 102a may have a function of preventing diffusion of impurities from the substrate 100 as the insulating film 101. In the case where the semiconductor film 106 is an oxide semiconductor film, the insulating film 102b can have a function of supplying oxygen to the semiconductor film 106.

The conductive films 116a and 116b each may be formed to have, for example, a single-layer structure or a stacked-layer structure including a conductive film containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film containing these elements may be used, for example, and a conductive film containing aluminum, a conductive film containing copper and titanium, a conductive film containing copper and manganese, a conductive film containing indium, tin, and oxygen, a conductive film containing titanium and nitrogen, or the like may be used.

The insulating films 110a and 110b may be formed to have, for example, a single-layer structure or a stacked-layer structure including an insulating film containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating films 110a and 110b may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The description of the insulating films 110a and 110b can be referred to for the insulating film 112.

The conductive film 104 can be referred to for the conductive film 114.

The oxide semiconductor film is preferably used as the semiconductor film 106. Note that silicon (including strained silicon), germanium, silicon germanium, silicon carbide, gallium arsenide, aluminum gallium arsenide, indium phosphide, gallium nitride, an organic semiconductor film, or the like can be used in some cases.

<Structure of Oxide Semiconductor>

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 2A:
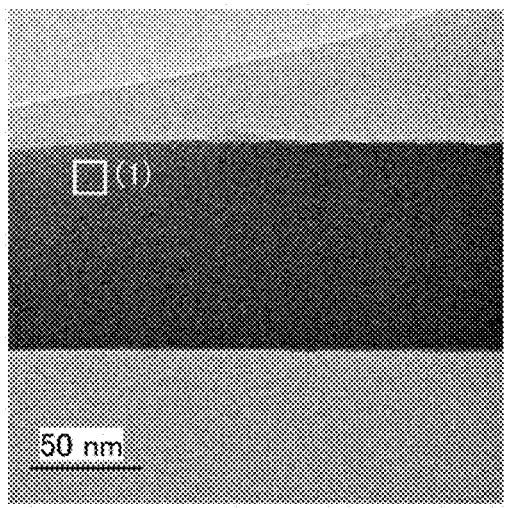
FIGS. 2A to 2D are Cs-corrected high-resolution TEM images of a cross section of a CAAC-OS and a cross-sectional schematic view of a CAAC-OS.

A CAAC-OS observed with TEM will be described below. FIG. 2A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 2B:
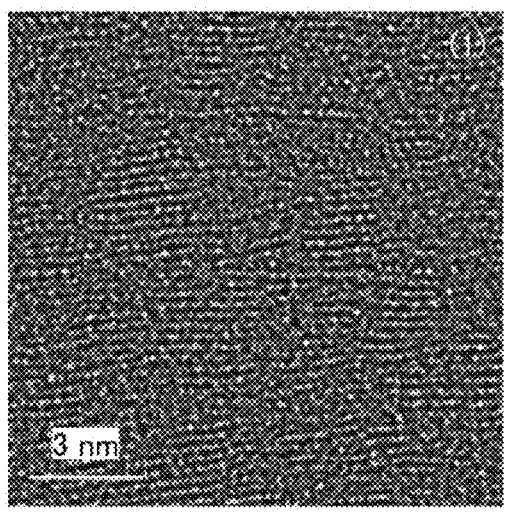

FIG. 2B is an enlarged Cs-corrected high-resolution TEM image of a region (1) in FIG. 2A. FIG. 2B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS film, and is arranged parallel to the formation surface or the top surface of the CAAC-OS film.

Figure 2C:
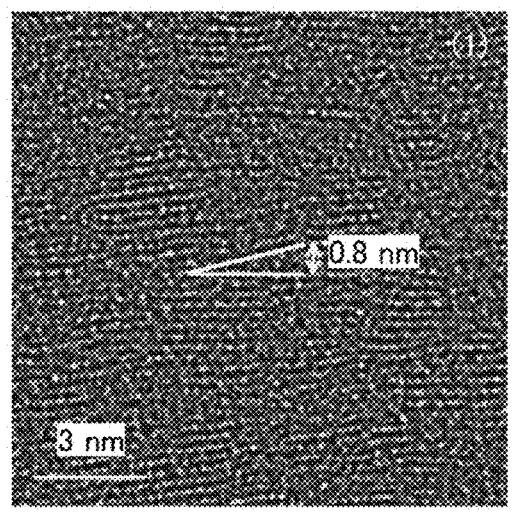

As shown in FIG. 2B, the CAAC-OS has a characteristic atomic arrangement. The characteristic atomic arrangement is denoted by an auxiliary line in FIG. 2C. FIGS. 2B and 2C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). The CAAC-OS can also be referred to as an oxide semiconductor including c-axis aligned nanocrystals (CANC).

Figure 2D:
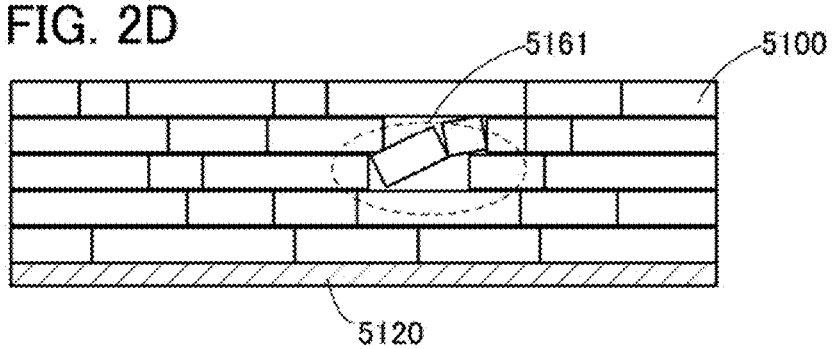

Here, the schematic arrangement of pellets 5100 of a CAAC-OS over a substrate 5120 is illustrated based on the Cs-corrected high-resolution TEM images, and a structure in which bricks or blocks are stacked is obtained (see FIG. 2D). The part in which the pellets are tilted as observed in FIG. 2C corresponds to a region 5161 shown in FIG. 2D.

FIG. 3A shows a Cs-corrected high-resolution TEM image of a plane of the CAAC-OS observed from a direction substantially perpendicular to the sample surface. FIGS. 3B, 3C, and 3D are enlarged Cs-corrected high-resolution TEM images of regions (1), (2), and (3) in FIG. 3A, respectively. FIGS. 3B, 3C, and 3D indicate that metal atoms are arranged in a triangular, quadrangular, or hexagonal configuration in a pellet. However, there is no regularity of arrangement of metal atoms between different pellets.

Figure 4A:
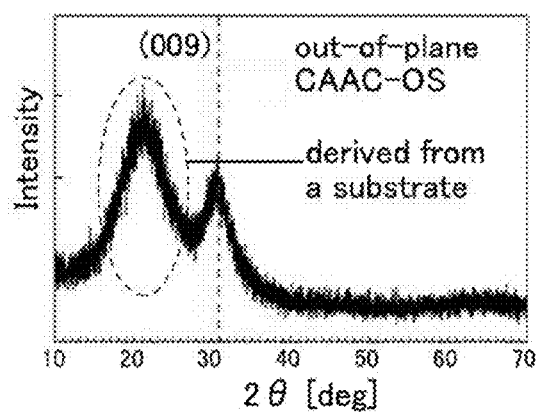
FIGS. 4A to 4C show structural analysis of a CAAC-OS and a single crystal oxide semiconductor by XRD.

Next, a CAAC-OS analyzed by X-ray diffraction (XRD) will be described. For example, when the structure of a CAAC-OS including an InGaZnO$_4$ crystal is analyzed by an out-of-plane method, a peak appears at a diffraction angle (2θ) of around 31° as shown in FIG. 4A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 4B:
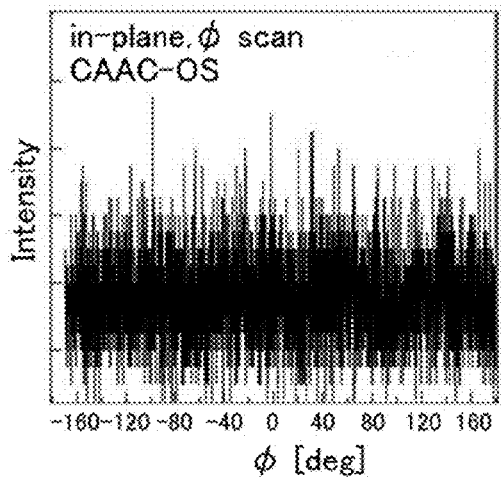
Figure 4C:
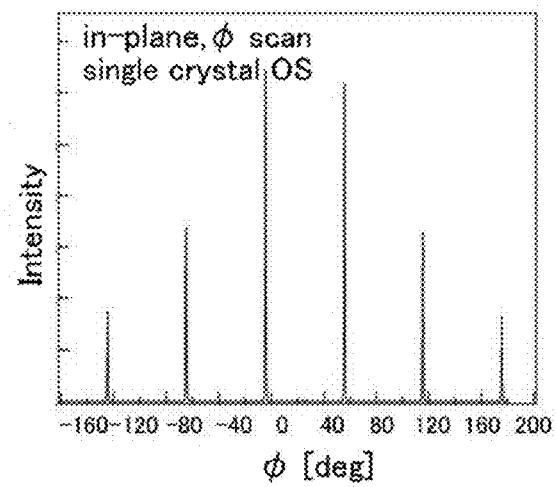

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 4B, a peak is not clearly observed. In contrast, in the case of a single crystal oxide semiconductor of InGaZnO$_4$, when φ scan is performed with 2θ fixed at around 56°, as shown in FIG. 4C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 5A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 5B shows a diffraction pattern obtained in such a manner that an electron beam with a probe diameter of 300 nm is incident on the same sample in a direction perpendicular to the sample surface. As shown in FIG. 5B, a ring-like diffraction pattern is observed. Thus, the electron diffraction also indicates that the a-axes and b-axes of the pellets included in the CAAC-OS do not have regular alignment. The first ring in FIG. 5B is considered to be derived from the (010) plane, the (100) plane, and the like of the InGaZnO$_4$ crystal. The second ring in FIG. 5B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 6:
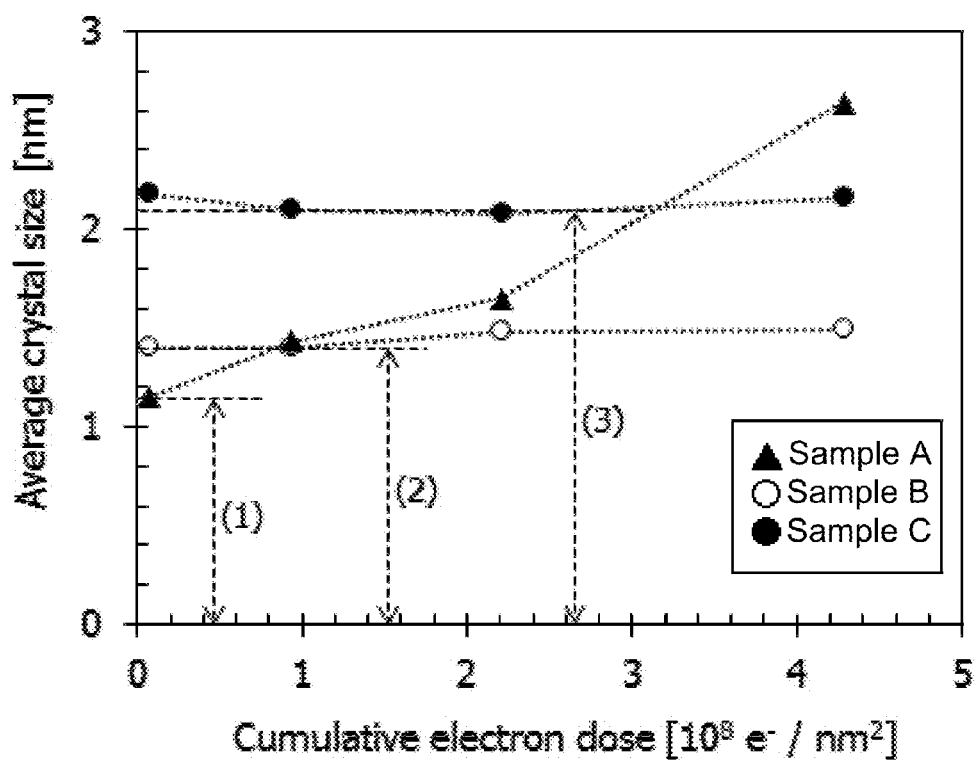
FIG. 6 shows a change in a crystal part of an In—Ga—Zn oxide by electron irradiation.

FIG. 6 shows change in the average size of crystal parts (at 22 points to 45 points) in each sample. Note that the crystal part size corresponds to the length of a lattice fringe. FIG. 6 indicates that the crystal part size in the a-like OS increases with an increase in the cumulative electron dose. Specifically, as shown by (1) in FIG. 6, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^1$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 6, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Figure 7A:
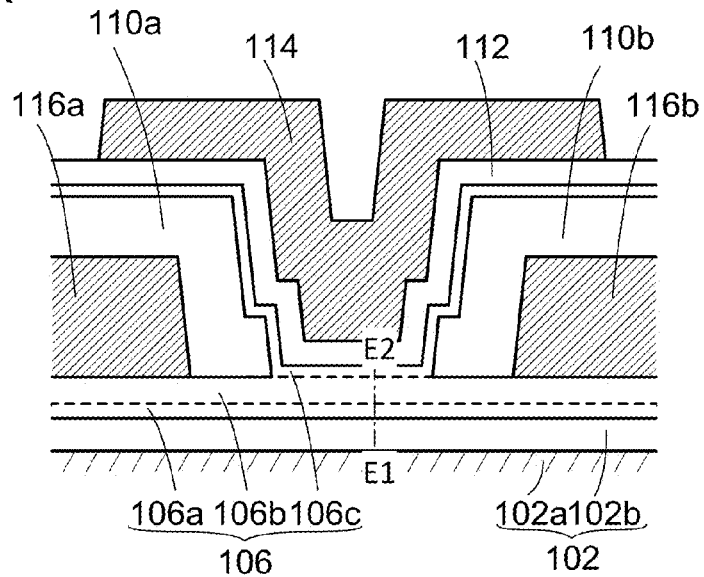
FIGS. 7A to 7C are cross-sectional views and a band diagram of part of a transistor.
Figure 7B:
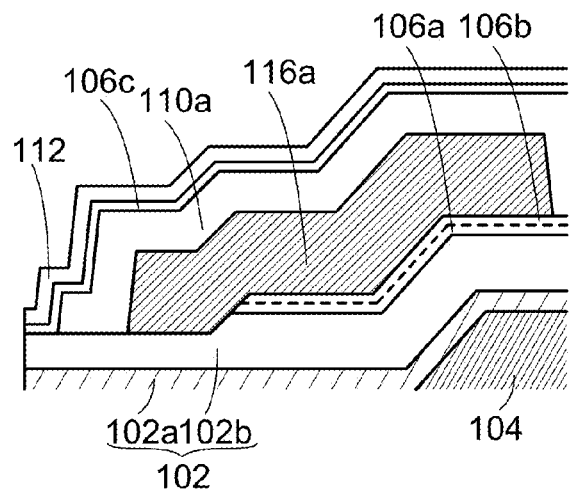

FIG. 7A is an enlarged cross-sectional view of a part of the transistor 150. FIG. 7A shows an example in which the semiconductor film 106 is formed of semiconductor films 106a, 106b, and 106c stacked in this order. Note that when the stacked film is processed into an island shape as shown in FIG. 7B, the insulating film 102 below the stacked film may be slightly overetched.

Semiconductors that can be used for the semiconductor film 106a, the semiconductor film 106b, the semiconductor film 106c, and the like will be described below.

The semiconductor film 106b is an oxide semiconductor film containing indium, for example. The semiconductor film 106b containing indium for example can have high carrier mobility (electron mobility). The semiconductor film 106b preferably contains an element M. The element M is preferably aluminum, gallium, yttrium, tin, or the like. Alternatively, boron, silicon, titanium, iron, nickel, germanium, yttrium, zirconium, molybdenum, lanthanum, cerium, neodymium, hathium, tantalum, tungsten, and the like can be used as the element M. Note that two or more of these elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. The semiconductor film 106b preferably contains zinc. When the oxide semiconductor contains zinc, the oxide semiconductor is easily to be crystallized in some cases.

Note that the semiconductor film 106b is not limited to the oxide semiconductor containing indium. The semiconductor film 106b may be, for example, an oxide semiconductor which does not contain indium and contains zinc, an oxide semiconductor which does not contain indium and contains gallium, or an oxide semiconductor which does not contain indium and contains tin, e.g., a zinc tin oxide, a gallium tin oxide, or gallium oxide.

For the semiconductor film 106b, an oxide with a wide energy gap is used. For example, the energy gap of the semiconductor film 106b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor films 106a and 106c include one or more elements other than oxygen included in the semiconductor film 106b. Since the semiconductor film 106a and the semiconductor film 106c each include one or more elements other than oxygen included in the semiconductor film 106b, an interface state is less likely to be formed at the interface between the semiconductor film 106a and the semiconductor film 106b and the interface between the semiconductor film 106b and the semiconductor film 106c.

A case where the semiconductor films 106a to 106c contain indium will be described. In the case of using an In-M-Zn oxide as the semiconductor film 106a, when the summation of In and M is assumed to be 100 atomic %, the proportions of In and M are preferably set to be less than or equal to 50 atomic % and greater than or equal to 50 atomic %, respectively, and further preferably less than or equal to 25 atomic % and greater than or equal to 75 atomic %, respectively. In the case of using an In-M-Zn oxide as the semiconductor film 106b, when the summation of In and M is assumed to be 100 atomic %, the proportions of In and M are preferably set to be greater than or equal to 25 atomic % and less than or equal to 75 atomic %, respectively, and further preferably greater than or equal to 34 atomic % and less than or equal to 66 atomic %, respectively. In the case of using an In-M-Zn oxide as the semiconductor film 106c, when the summation of In and M is assumed to be 100 atomic %, the proportions of In and M are preferably set to be less than or equal to 50 atomic % and greater than or equal to 50 atomic %, respectively, and further preferably less than or equal to 25 atomic % and greater than or equal to 75 atomic %, respectively. Note that the semiconductor film 106c may be an oxide similar to the semiconductor film 106c.

An oxide having an electron affinity higher than that of the semiconductor films 106a and 106c is used as the semiconductor film 106b. For example, as the semiconductor film 106b, an oxide having a higher electron affinity than the semiconductor films 106a and 106c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor film 106c preferably includes an indium gallium oxide. The gallium atomic ratio [Ga/(In+Ga)] is, for example, higher than or equal to 70%, preferably higher than or equal to 80 %, more preferably higher than or equal to 90%.

Note that the semiconductor films 106a and/or 106c may be gallium oxide. For example, when gallium oxide is used for the semiconductor film 106c, a leakage current generated between the conductive film 116a or 116b and the conductive film 114 can be reduced. In other words, the off-state current of the transistor 150 can be reduced.

When a gate voltage is applied from the conductive film 114 to the semiconductor film 106, a channel is formed in the semiconductor film 106b having an electron affinity higher than those of the semiconductor film 106a and the semiconductor film 106b.

Figure 7C:
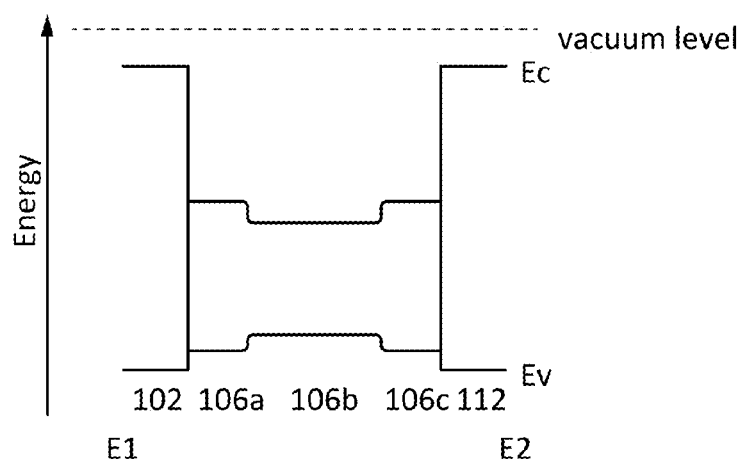

FIG. 7C is a band diagram taken along dashed-dotted line E1-E2 in FIG. 7A. FIG. 7C shows a vacuum level (denoted by vacuum level), and an energy of the bottom of the conduction band (denoted by Ec) and an energy of the top of the valence band (denoted by Ev) of each of the layers.

Here, in some cases, there is a mixed region of the semiconductor film 106a and the semiconductor film 106b between the semiconductor film 106a and the semiconductor film 106b. Furthermore, in some cases, there is a mixed region of the semiconductor film 106b and the semiconductor film 106c between the semiconductor film 106b and the semiconductor film 106c. The mixed region has a low density of interface states. For that reason, the stack of the semiconductor film 106a, the semiconductor film 106b, and the semiconductor film 106c has a band structure where energy at each interface and in the vicinity of the interface is changed continuously (continuous junction).

At this time, electrons move mainly in the semiconductor film 106b, not in the semiconductor films 106a and 106c. That is, electrons are embedded in the semiconductor film 106b. When the interface state density at the interface between the semiconductor film 106a and the semiconductor film 106b and the interface state density at the interface between the semiconductor film 106b and the semiconductor film 106c are decreased, electron movement in the semiconductor film 106b is less likely to be inhibited. The on-sate current of the transistor 150 can be thus increased due to low channel resistance.

In the case where the transistor 150 has an s-channel structure, a channel is formed in the whole of the semiconductor film 106b. Therefore, as the semiconductor film 106b has a larger thickness, a channel region becomes larger. In other words, the thicker the semiconductor film 106b is, the larger the on-state current of the transistor 150 is. For example, the semiconductor film 106b has a region with a thickness of greater than or equal to 10 nm, preferably greater than or equal to 40 nm, more preferably greater than or equal to 60 nm, or still more preferably greater than or equal to 100 nm. Note that the semiconductor film 106b has a region with a thickness of, for example, less than or equal to 300 nm, preferably less than or equal to 200 nm, or more preferably less than or equal to 150 nm because the productivity of the semiconductor device including the transistor 150 might be decreased.

Moreover, the thickness of the semiconductor film 106c is preferably as small as possible to increase the on-state current of the transistor 150. The thickness of the semiconductor film 106c is less than 10 nm, preferably less than or equal to 5 nm, more preferably less than or equal to 3 nm, for example. Meanwhile, the semiconductor film 106c has a function of blocking elements other than oxygen (such as hydrogen and silicon) included in the adjacent insulator from entering the semiconductor film 106b where a channel is formed. For this reason, it is preferable that the oxide semiconductor film 106c have a certain thickness. The thickness of the semiconductor film 106c is greater than or equal to 0.3 nm, preferably greater than or equal to 1 nm, more preferably greater than or equal to 2 nm, for example. The semiconductor film 106c preferably has an oxygen blocking property to suppress outward diffusion of oxygen released from the insulating film 102 and the like.

To improve reliability, preferably, the thickness of the semiconductor film 106a is large and the thickness of the semiconductor film 106c is small. For example, the semiconductor film 106a has a region with a thickness of, for example, greater than or equal to 10 nm, preferably greater than or equal to 20 nm, more preferably greater than or equal to 40 nm, still more preferably greater than or equal to 60 nm. When the thickness of the semiconductor film 106a is made large, a distance from an interface between the adjacent insulator and the semiconductor film 106a to the semiconductor film 106b in which a channel is formed can be large. Since the productivity of the semiconductor device including the transistor 150 might be decreased, the semiconductor film 106a has a region with a thickness, for example, less than or equal to 200 nm, preferably less than or equal to 120 nm, or further preferably less than or equal to 80 nm.

Silicon in the oxide semiconductor might serve as a carrier trap or a carrier generation source, for example. Therefore, the silicon concentration in the semiconductor film 106b is preferably as low as possible. For example, a region with the silicon concentration of lower than $1\times10^{19}$ atoms/cm$^3$, preferably lower than $5\times10^{18}$ atoms/cm$^3$, or further preferably lower than $2\times10^{18}$ atoms/cm$^3$ which is measured by secondary ion mass spectrometry (SIMS) is provided between the semiconductor film 106b and the semiconductor film 106a. A region with the silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor film 106b and the semiconductor film 106c.

It is preferable to reduce the concentration of hydrogen in the semiconductor film 106a and the semiconductor film 106c in order to reduce the concentration of hydrogen in the semiconductor film 106b. The semiconductor film 106a and the semiconductor film 106c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor film 106a and the semiconductor film 106c in order to reduce the concentration of nitrogen in the semiconductor film 106b. The semiconductor layers 406a and 406c each have a region in which the concentration of nitrogen measured by SIMS is lower than $5\times10^{19}$ atoms/cm$^3$, preferably less than or equal to $5\times10^{18}$ atoms/cm$^3$, more preferably less than or equal to $1\times10^{18}$ atoms/cm$^3$, still more preferably less than or equal to $5\times10^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor film 106b is preferably as low as possible. For example, the semiconductor film 106b preferably has a region in which the concentration of copper is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

Note that in order that a transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to the state where an oxide semiconductor has a carrier density lower than or equal to $1\times10^{17}$/cm$^3$, preferably lower than or equal to $1\times10^{15}$/cm$^3$, further preferably lower than or equal to $1\times10^{13}$/cm$^3$, further preferably lower than or equal to $1\times10^{11}$/cm$^3$, further preferably lower than or equal to $1\times10^{10}$/cm$^3$ and higher than or equal to $1\times10^{-9}$/cm$^3$.

The above three-layer structure is an example. For example, a two-layer structure without the semiconductor film 106a or the semiconductor film 106c may be employed. A four-layer structure in which any one of the semiconductors described as examples of the semiconductor film 106a, the semiconductor film 106b, and the semiconductor film 106c is provided below or over the semiconductor film 106a or below or over the semiconductor film 106c may be employed. An n-layer structure (n is an integer of 5 or more) in which any one of the semiconductors described as examples of the semiconductor film 106a, the semiconductor film 106b, and the semiconductor film 106c is provided at two or more of the following positions: over the semiconductor film 106a, below the semiconductor film 106a, over the semiconductor film 106c, and below the semiconductor film 106c.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The substrate 100 has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 100 has a small thickness, the weight of the semiconductor device including the transistor 150 can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

Figure 8A:
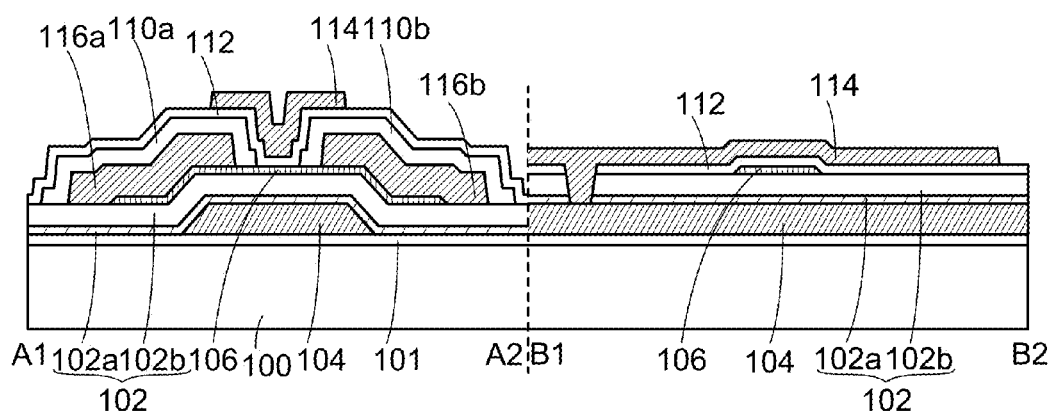
FIGS. 8A and 8B are cross-sectional views of a transistor.
Figure 8B:
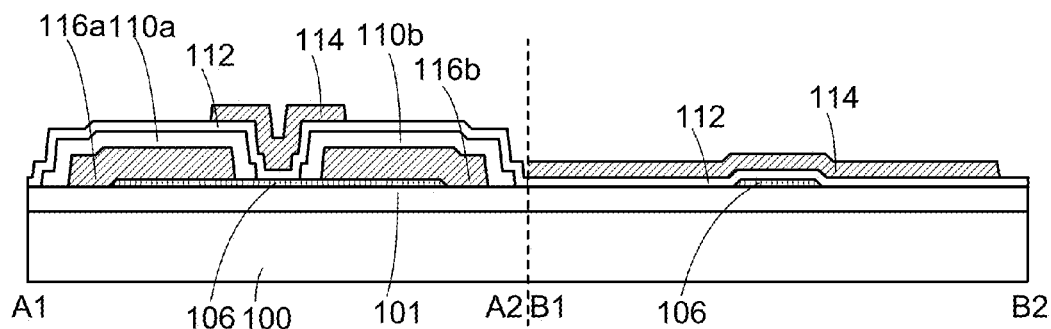

Note that the transistor 150 may have a cross-sectional structure shown in FIG. 8A or 8B. The structure in FIG. 8A is different from that in FIG. 1B in that the conductive film 114 is electrically connected to the conductive film 104. The structure in FIG. 8B is different from that in FIG. 1B in that the conductive film 104 and the insulating film 102 are not provided.

<Manufacturing Method of Transistor Structure 1>

A method for manufacturing the transistor 150 illustrated in FIGS. 1A to 1C is described below.

First, the substrate 100 is prepared.

Next, the insulating film 101 is formed. The insulating film 101 may be formed by a sputtering method, a chemical vapor deposition (CVD) method, a molecular beam epitaxy (MBE) method, a pulsed laser deposition (PLD) method, an atomic layer deposition (ALD) method, or the like.

A CVD method includes a plasma enhanced CVD (PECVD) method using plasma, a thermal CVD (TCVD) method using heat, a photo CVD method using light, and the like. Moreover, a CVD method can be classified into a metal CVD (MCVD) method and a metal organic CVD (MOCVD) method depending on a source gas.

By using a PECVD method, a high-quality film can be formed at a relatively low temperature. A thermal CVD method, which does not use plasma, is a film formation method with less plasma damage to an object of the treatment. For example, a wiring, an electrode, an element (e.g., a transistor or a capacitor), and the like included in a semiconductor device may receive charges from plasma, and charge buildup may occur in some cases. In that case, because of the accumulated charges, the wiring, the electrode, the element, or the like in the semiconductor device may be broken. Such plasma damage does not occur in the case of using a thermal CVD method, and thus the yield of a semiconductor device can be increased. In addition, since plasma damage does not occur in the film formation by a thermal CVD method, a film with few defects can be obtained.

In addition, an ALD method is also a film formation method with less plasma damage to an object of the treatment. By using an ALD method, a film with few defects can be obtained since the plasma damage does not occur.

Different from a film formation method whereby particles released from a target are deposited, a CVD method and an ALD method are film formation methods whereby a film is formed by a reaction at a surface of an object of the treatment. Therefore, they are film formation methods whereby a film with favorable coverage is formed without being greatly affected by the shape of the object. In particular, a film formed by an ALD method has favorable coverage and excellent uniformity in thickness. Therefore, an ALD method is preferred for forming a film covering a surface of an opening with a high aspect ratio. However, film formation speed of an ALD method is relatively slow, and thus it may be preferable to use an ALD method in combination with another film formation method with high film formation speed such as a CVD method in some cases.

By a CVD method and an ALD method, a film with a desired composition can be formed by adjusting a flow rate ratio of the source gases. For example, a film with a certain composition can be formed by adjusting a flow rate ratio of the source gases. Furthermore, with a CVD method and an ALD method, a film with a gradually-changed composition can be formed by changing a flow rate ratio of the source gases during deposition. In the case where a film is formed while changing a flow rate ratio of the source gases, as compared to the case where a film is formed using a plurality of deposition chambers, time taken for the film formation can be reduced because time taken for transfer and pressure adjustment can be omitted. Thus, semiconductor devices can be manufactured with improved productivity.

Next, a conductive film is formed. The conductive film can be formed by a sputtering method, a CVD method, an MBE method, an ALD method, or a PLD method.

Figure 9A:
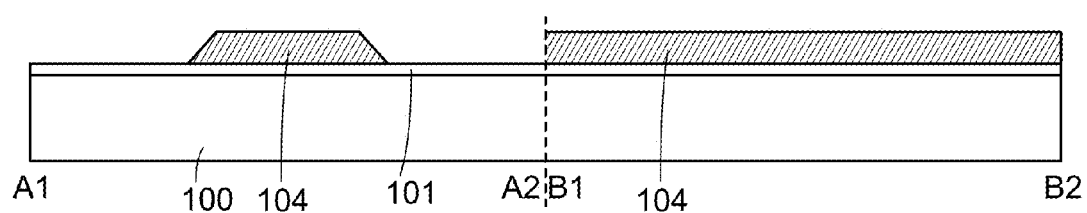
FIGS. 9A to 9C are cross-sectional views illustrating a method for manufacturing a transistor.

The conductive film is processed by a photolithography method or the like, thereby forming the conductive film 104 (see FIG. 9A).

In the photolithography method, first, a resist is exposed to light through a photomask. Next, a region exposed to light is removed or left using a developing solution, so that a resist mask is formed. Then, etching through the resist mask is conducted. As a result, a conductive film, a semiconductor film, an insulating film, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing and/or wet etching treatment can be used for removal of the resist mask.

Figure 9B:
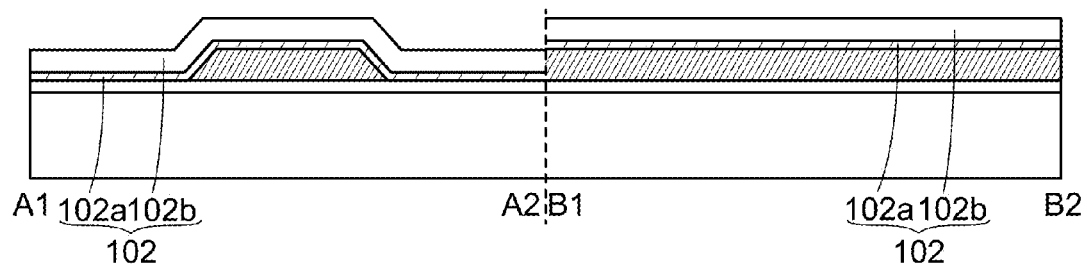

The insulating films 102a and 102b are formed (see FIG. 9B). The insulating films 102a and 102b can be formed by a sputtering method, a CVD method, a MBE method, a PLD method, an ALD method, or the like. Note that the insulating films 102a and 102b are collectively referred to as the insulating film 102.

Next, treatment to add oxygen to the insulating film 102 may be performed. An ion implantation method, a plasma treatment method, or the like can be used for the treatment to add oxygen. Note that oxygen added to the insulating film 102 is excess oxygen.

A semiconductor film is then formed by a sputtering method, a CVD method, an MBE method, an ALD method, or a PLD method.

Next, treatment to add oxygen to the semiconductor film may be performed. An ion implantation method, a plasma treatment method, or the like can be used for the treatment to add oxygen. Note that oxygen added to the semiconductor film becomes excess oxygen. When the semiconductor film is a stacked-layer film, oxygen is preferably added to a layer of the semiconductor to be the semiconductor film 106 in FIG. 1A.

Next, first heat treatment is preferably performed. The first heat treatment is performed at a temperature of higher than or equal to 150° C. and lower than the strain point of the substrate, preferably higher than or equal to 200° C. and lower than or equal to 480° C., more preferably higher than or equal to 300° C. and lower than or equal to 480° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example.

Figure 9C:
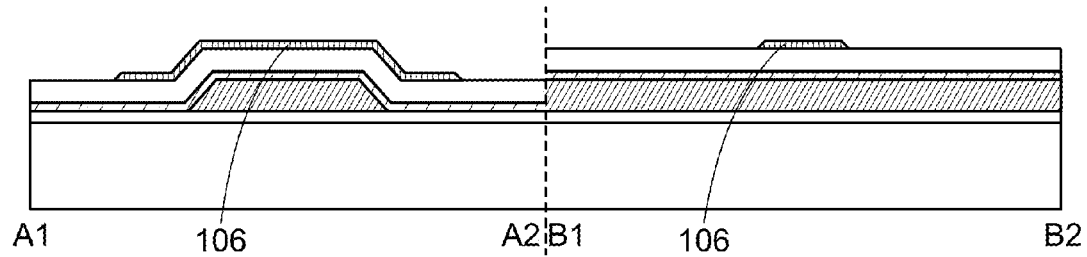

The semiconductor film is then processed by a photolithography method or the like to form the semiconductor film 106 (see FIG. 9C).

After that, a conductive film is formed. The conductive film can be formed by a sputtering method, a CVD method, an MBE method, an ALD method, or a PLD method.

Figure 10A:
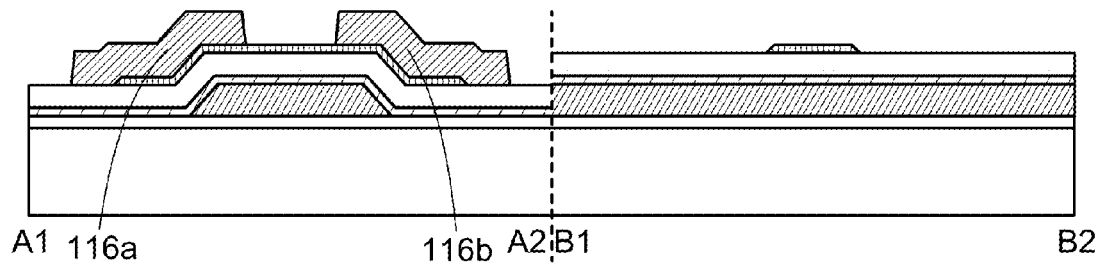
FIGS. 10A to 10C are cross-sectional views illustrating a method for manufacturing a transistor.

Then, the conductive film is processed by a photolithography method or the like, thereby forming the conductive films 116a and 116b (see FIG. 10A).

An insulating film is formed by a sputtering method, a CVD method, an MBE method, an ALD method, or a PLD method.

Figure 10B:
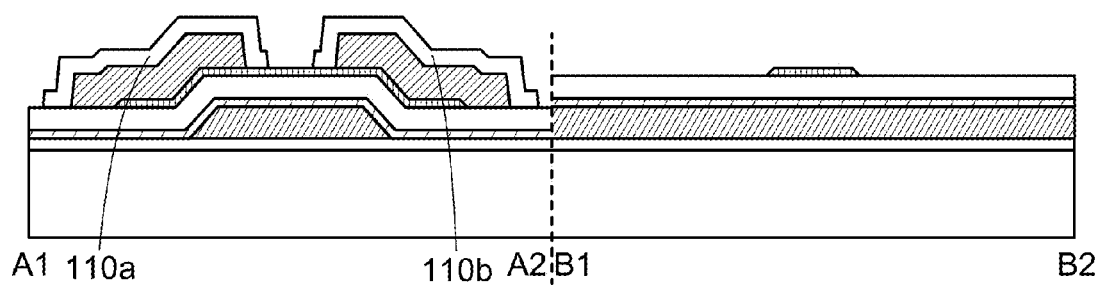
Figure 10C:
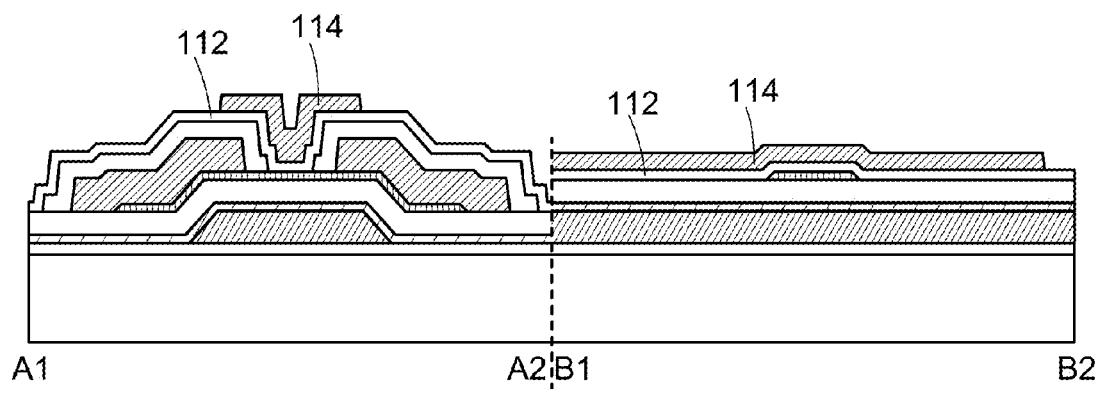

The insulating film is processed by the photolithography method or the like to form the insulating films 110a and 110b (FIG. 10B).

An insulating film is formed by a sputtering method, a CVD method, an MBE method, an ALD method, or a PLD method.

The insulating film is processed by the photolithography method or the like, thereby forming the insulating film 112.

Next, a conductive film is formed. Here, the conductive film can be formed by a sputtering method, a CVD method, an MBE method, an ALD method, or a PLD method.

The conductive film is processed by the photolithography method or the like, thereby forming the conductive film 114.

Note that an insulating film may be deposited after the conductive film 114 is formed. The insulating film can be formed by a sputtering method, a CVD method, an MBE method, an ALD method, or a PLD method. Second heat treatment may be performed at any time after the formation of the insulating film. Excess oxygen included in the insulating film 102 and the like moves into the semiconductor film 106 by performing the second heat treatment, whereby defects (oxygen vacancies) in the semiconductor film 106 can be reduced. Note that the second heat treatment may be performed at a temperature such that excess oxygen (oxygen) in the insulating film 102 is diffused to the semiconductor film 106. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulating film 102 can be inhibited. Note that in the case where heating at the time of formation of the layers doubles as the second heat treatment, the second heat treatment is not necessarily performed.

Through these steps, the transistor 150 illustrated in FIGS. 1A to 1C can be fabricated.

The parasitic capacitance of the transistor 150 between the conductive films 114 and 116a and between the conductive films 114 and 116b can be small owing to the insulating films 110a and 110b. The reduction in parasitic capacitance can improve operation speed of the semiconductor device. A large part of the semiconductor film 106 is made in contact with the conductive film 116a or 116b, whereby parasitic resistance can be reduced. The reduction in parasitic resistance can increase on-state current.

<Transistor Structure 2>

Figure 11A:
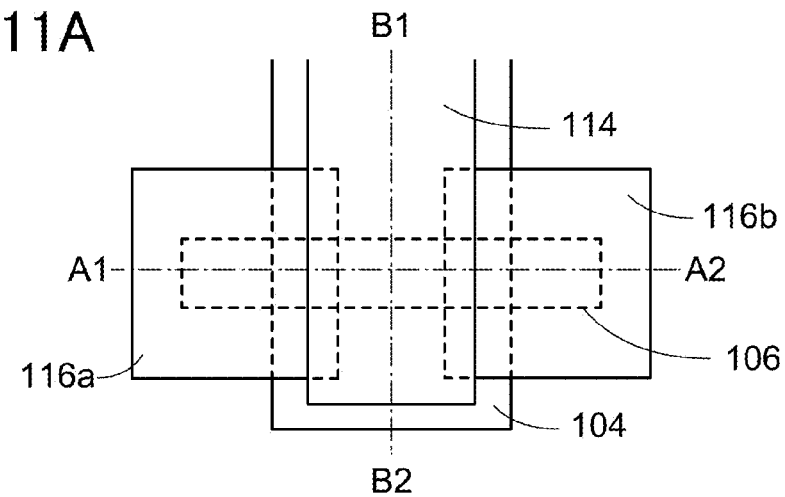
FIGS. 11A to 11C are a top view and cross-sectional views of a transistor.
Figure 11B:
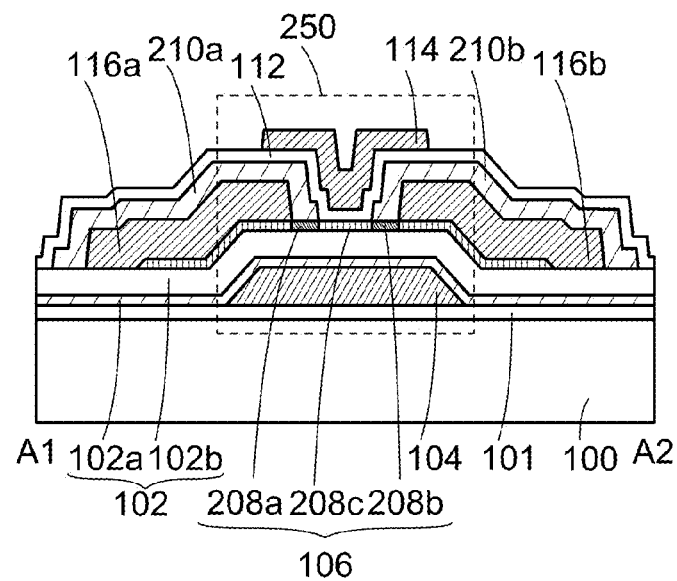
Figure 11C:
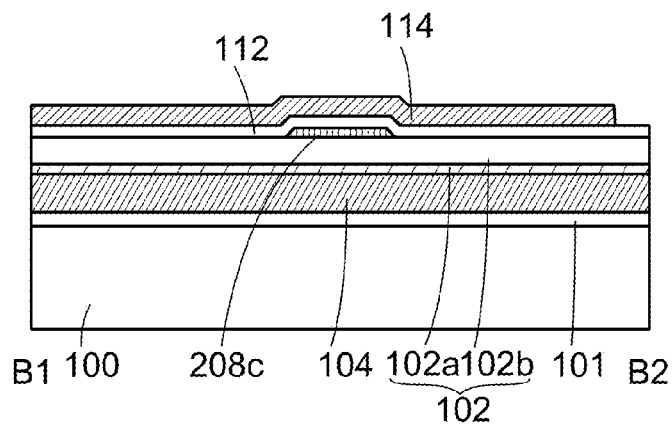

A transistor 250, which has a different structure from the transistor 150 in FIGS. 1A to 1C and the like, is described below. FIGS. 11A to 11C are a top view and cross-sectional views of the transistor 250 of one embodiment of the present invention.

FIG. 11A is the top view. FIGS. 11B and 11C are the cross-sectional views taken along dashed-dotted line A1-A2 and dashed-dotted line B1-B2 in FIG. 11A. Note that some components in the top view in FIG. 11A are not illustrated for simplification of the drawing.

The transistor 250 in FIG. 11B includes the insulating film 101 over the substrate 100, the conductive film 104 over the insulating film 101, the insulating film 102 over the conductive film 104, the semiconductor film 106 over the insulating film 102, the conductive film 116a and the conductive film 116b each including a region in contact with a top surface and a side surface of the semiconductor film 106, an insulating film 210a over the semiconductor film 106 in contact with a top surface and side surfaces of the conductive film 116a, an insulating film 210b over the semiconductor film 106 in contact with a top surface and side surfaces of the conductive film 116b, the insulating film 112 over the insulating film 210a, the insulating film 210b, and the semiconductor film 106, and a conductive film 114 over the insulating film 112. Part of the conductive film 114 overlaps the semiconductor film 106. The semiconductor film 106 includes a low-resistance region 208a, a low-resistance region 208b, and a low-resistance region 208c.

Note that the transistor 250 does not necessarily include the insulating film 101.

The insulating film 101 in the transistor 250 functions as a base insulating film. The conductive film 104 functions as a gate electrode. The insulating film 102 functions as a gate insulating film. The conductive films 116a and 116b function as a source electrode and a drain electrode. The insulating film 112 functions as a gate insulating film. The conductive film 114 functions as a gate electrode. The resistance of the semiconductor film 106 can be controlled by the potential applied to the conductive film 104 or 114. That is, the conduction between the conductive films 116a and 116b can be controlled in accordance with the potential applied to the conductive film 104 or 114.

The semiconductor film 106 in the transistor 250 includes a region in contact with the conductive film 116a, a region in contact with the insulating film 210a, a region in contact with the insulating film 112, a region in contact with the insulating film 210b, and a region in contact with the conductive film 116b.

Note that when the insulating films 210a and 210b are nitride insulating films such as silicon nitride or silicon nitride oxide, hydrogen contained in the nitride insulating films can be moved to the semiconductor film 106. The low-resistance regions 208a and 208b having lower resistance than the semiconductor film 106 can be formed consequently.

At this time, an ohmic contact is made between the conductive film 116a and the low-resistance region 208a because an energy barrier therebetween is sufficiently low. An ohmic contact is also made between the conductive film 116b and the low-resistance region 208b because an energy barrier therebetween is sufficiently low. Thus, electrons can be smoothly transferred between the conductive films 116a and 116b and the semiconductor film 106 including the low-resistance regions 208a and 208b.

As described above, the semiconductor device in which channel resistance is small and electrons are smoothly transferred between the conductive films 116a and 116b and the semiconductor film 106 has favorable switching characteristics.

Because the transistor 250 includes the insulating films 210a, 210b, and 112 between the conductive films 114 and 116a and between the conductive films 114 and 116b, the parasitic capacitance can be reduced.

Figure 12A:
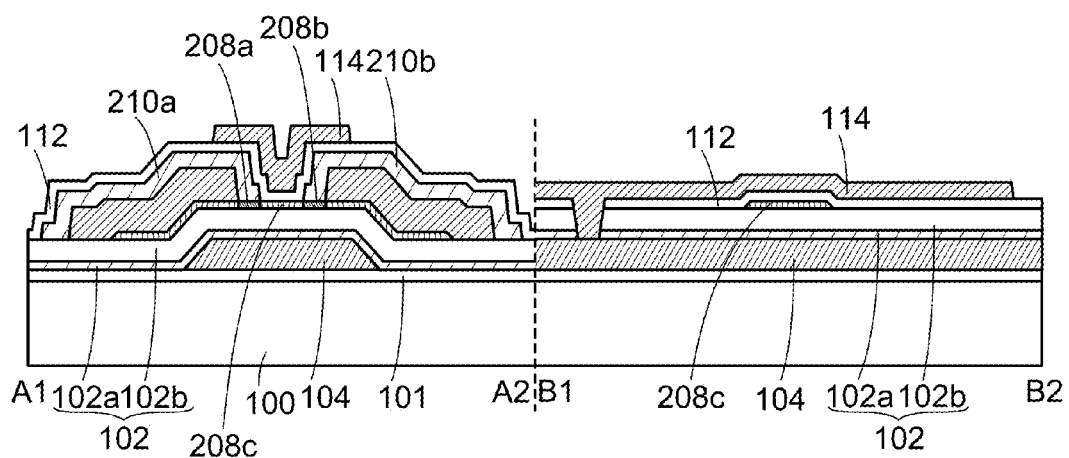
FIGS. 12A and 12B are cross-sectional views of transistors.
Figure 12B:
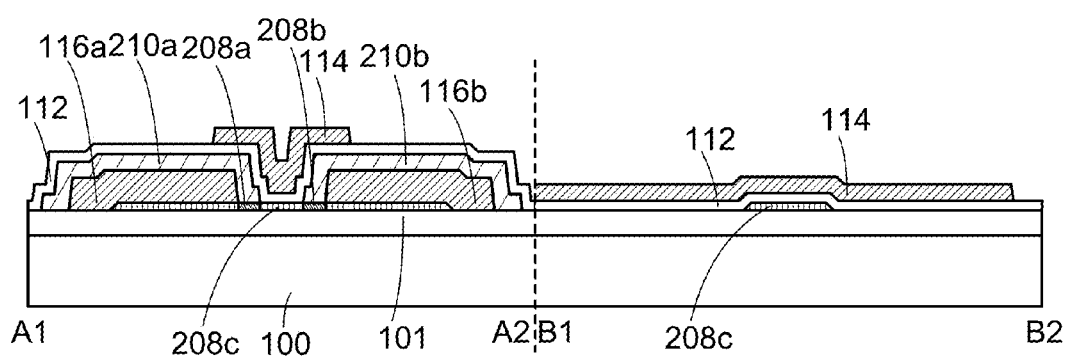

Note that the transistor 250 may have a cross-sectional structure shown in FIG. 12A or 12B. The structure in FIG. 12A is different from that in FIG. 11B in that the conductive film 114 is electrically connected to the conductive film 104. The structure in FIG. 12B is different from that in FIG. 11B in that the conductive film 104 and the insulating film 102 are not provided.

<Manufacturing Method of Transistor Structure 2>

A method for manufacturing the transistor 250 illustrated in FIGS. 11A to 11C will be described.

Figure 13A:
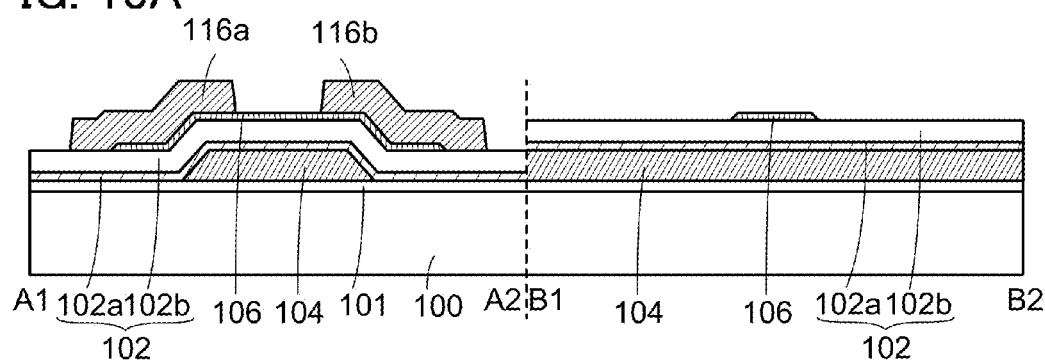
FIGS. 13A to 13C are cross-sectional views illustrating a method for manufacturing a transistor.

First, the substrate 100 is prepared. Next, the base insulating film 101 is formed. Then, a conductive film is formed and processed by a photolithography method or the like, thereby forming the conductive film 104. The insulating films 102a and 102b are then formed. A semiconductor film is formed and processed by a photolithography method or the like, thereby forming the semiconductor film 106. Next, a conductive film is formed and is processed by a photolithography method or the like, the conductive films 116a and 116b are formed thereby (see FIG. 13A). The manufacturing method of the transistor structure 1 with reference to FIGS. 9A to 9C and FIG. 10A can be referred to for the process so far.

Figure 13B:
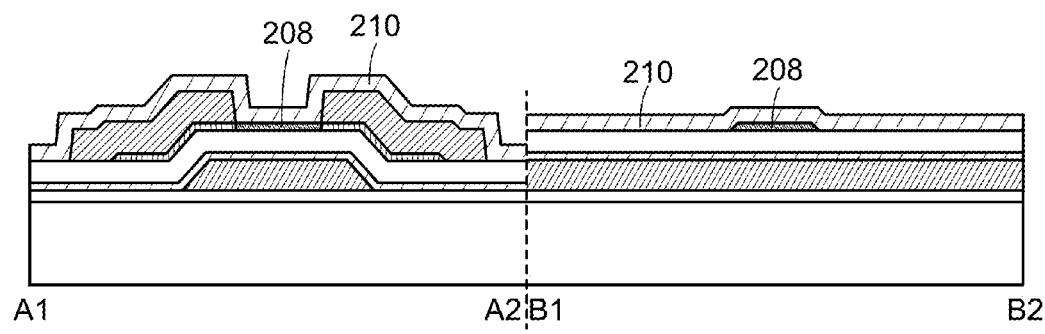

Next, the insulating film 210 is formed by a sputtering method, a CVD method, an MBE method, an ALD method, or a PLD method. Note that the insulating film 210 is a nitride insulating film which can move hydrogen contained in the nitride insulating film to the semiconductor film 106. Consequently, a low-resistance region 208 is formed in the semiconductor film 106 (see FIG. 13B).

Figure 13C:
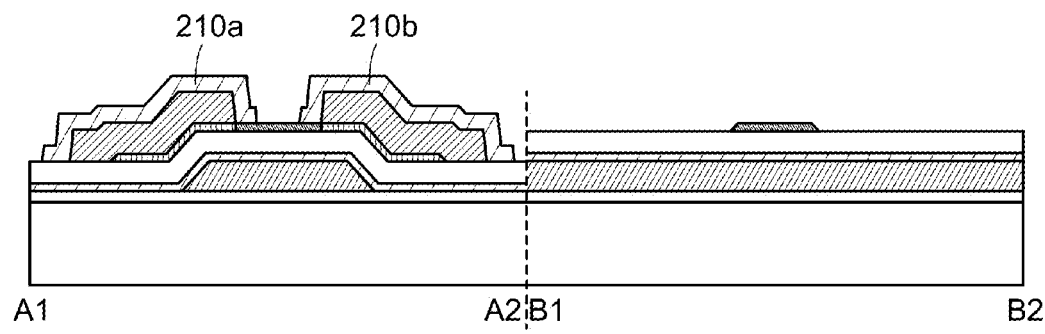

Next, the insulating film 210 is processed by a photolithography method or the like to form the insulating films 210a and 210b (see FIG. 13C).

Next, an insulating film is formed by a sputtering method, a CVD method, an MBE method, an ALD method, a PLD method, or the like.

Figure 14A:
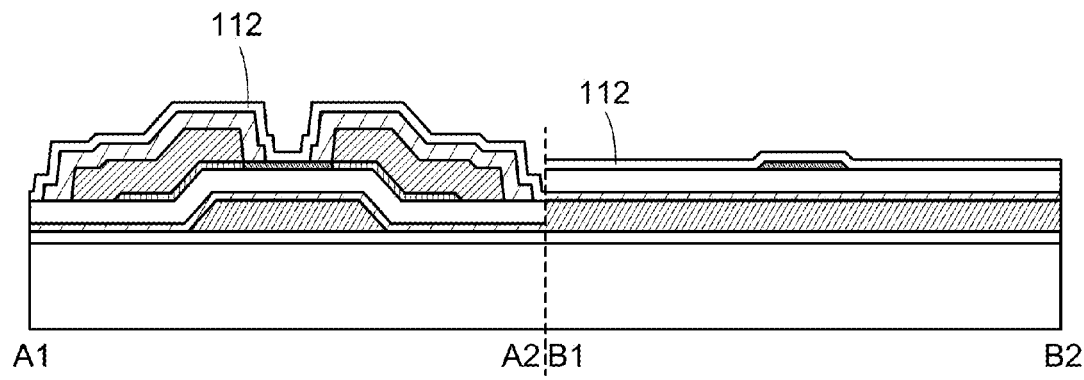
FIGS. 14A and 14B are cross-sectional views illustrating a method for manufacturing a transistor.
Figure 14B:
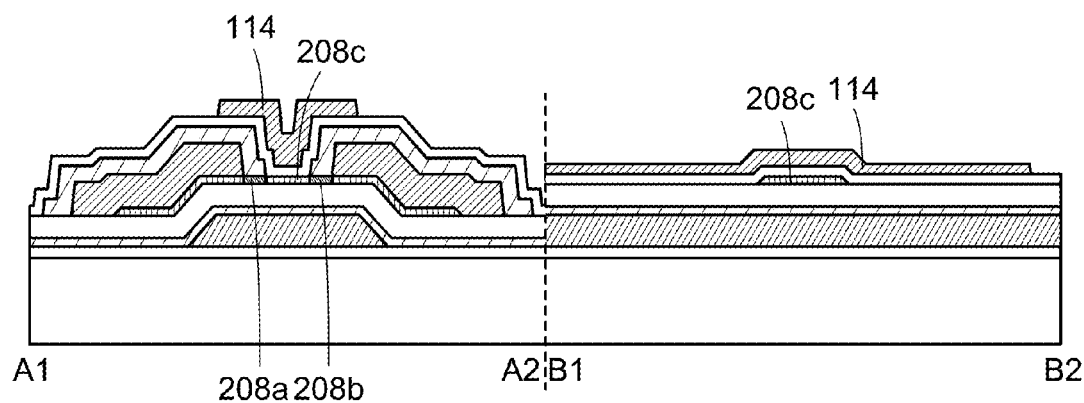

Next, the insulating film is processed by a photolithography method or the like to form the insulating film 112 (see FIG. 14A).

Next, second heat treatment is performed. Excess oxygen included in the insulating film 102 and the like moves into the semiconductor film 106 by performing the second heat treatment, whereby defects (oxygen vacancies) in the semiconductor film 106 can be reduced. That is, excess oxygen contained in the insulating film 102 and the like moves into regions of the low-resistance region 208 being not in contact with the insulating films 210a and 210b, so that the channel formation region 208c is formed. Hydrogen contained in the insulating films 210a and 210b moves into the semiconductor film 106, so that the low-resistance regions 208a and 208b are formed in regions of the low-resistance region 208 being in contact with the insulating films 210a and 210b. Note that the second heat treatment may be performed at a temperature such that excess oxygen (oxygen) in the insulating film 102 is diffused to the semiconductor film 106. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulating film 102 can be inhibited. Note that the second heat treatment is not necessarily performed when heating during formation of the films can work as heat treatment comparable to the second heat treatment.

Next, a conductive film is formed by a sputtering method, a CVD method, an MBE method, an ALD method, a PLD method, or the like.

The insulating film is processed by a photolithography method or the like to form the insulating film 114.

Through this process, the transistor 250 illustrated in FIGS. 11A to 11C can be fabricated.

Since the insulating films 210a and 210b which are nitride insulating films are provided in the transistor 250, the low-resistance regions 208a and 208b can be formed. Ohmic contacts are made between the conductive film 116a and the low-resistance region 208a and between the conductive film 116b and the low-resistance region 208b because an energy barrier therebetween is sufficiently low. The semiconductor device in which channel resistance is small and electrons are smoothly transferred between the conductive films 116a and 116b and the semiconductor film 106 including the low-resistance regions 208a and 208b has favorable switching characteristics.

The parasitic capacitance between the conductive films 114 and 116a and between the conductive films 114 and 116b can be small owing to the insulating films 210a and 210b. The reduction in parasitic capacitance can improve operation speed of the semiconductor device. A large part of the semiconductor film 106 is made in contact with the conductive film 116a or 116b, whereby parasitic resistance can be reduced. The reduction in parasitic resistance can increase on-state current.

<Transistor Structure 3>

Figure 15A:
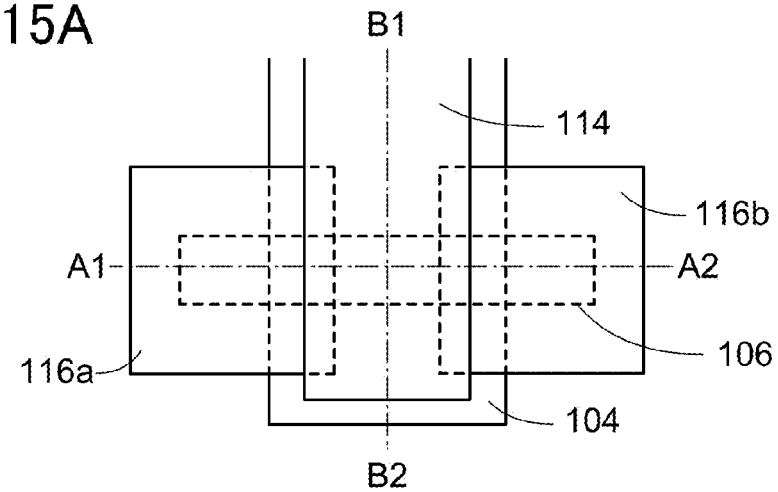
FIGS. 15A to 15C are a top view and cross-sectional views of a transistor.
Figure 15B:
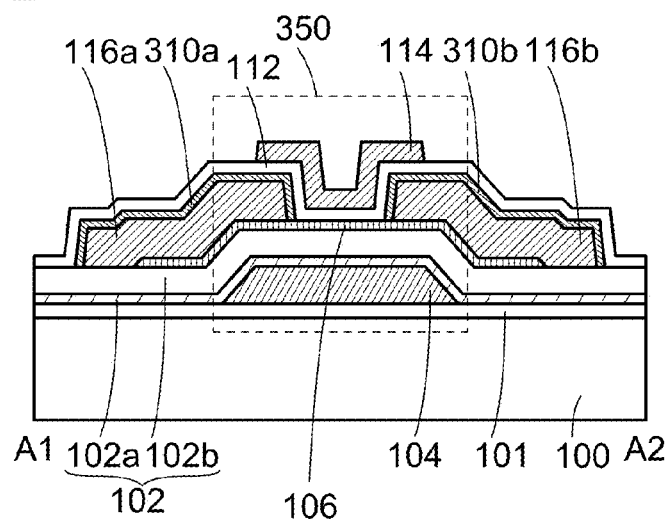
Figure 15C:
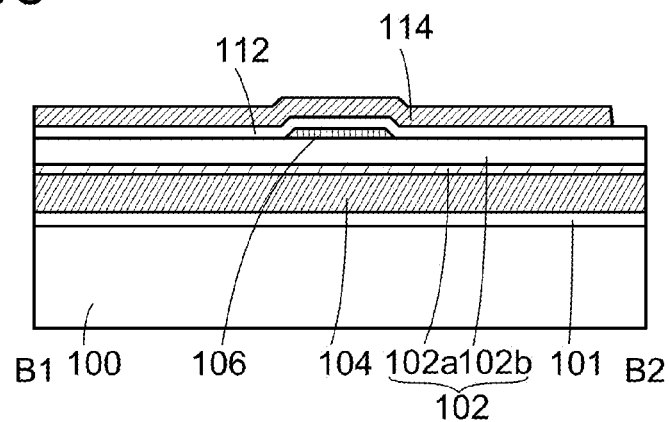

A transistor 350, which has a different structure from the transistors, is described below. FIGS. 15A to 15C are a top view and cross-sectional views of the transistor 350 of one embodiment of the present invention. FIG. 15A is the top view. FIGS. 15B and 15C are the cross-sectional views taken along dashed-dotted line A1-A2 and dashed-dotted line B1-B2 in FIG. 15A. Note that some components in the top view in FIG. 15A are not illustrated for simplification of the drawing.

The transistor 350 in FIG. 15B includes the insulating film 101 over the substrate 100, the conductive film 104 over the insulating film 101, the insulating film 102 over the conductive film 104, the semiconductor film 106 over the insulating film 102, the conductive film 116a and the conductive film 116b each including a region in contact with a top surface and a side surface of the semiconductor film 106, an insulating film 310a over the semiconductor film 106 in contact with a top surface and side surfaces of the conductive film 116a, an insulating film 310b over the semiconductor film 106 in contact with a top surface and side surfaces of the conductive film 116b, the insulating film 112 over the insulating film 310a, the insulating film 310b, and the semiconductor film 106, and a conductive film 114 over the insulating film 112. Part of the conductive film 114 overlaps the semiconductor film 106.

Note that the transistor 350 does not necessarily include the insulating film 101.

The insulating film 101 in the transistor 350 functions as a base insulating film. The conductive film 104 functions as a gate electrode. The insulating film 102 functions as a gate insulating film. The conductive films 116a and 116b function as a source electrode and a drain electrode. The insulating film 112 functions as a gate insulating film. The conductive film 114 functions as a gate electrode. The resistance of the semiconductor film 106 can be controlled by the potential applied to the conductive film 104 or 114. That is, the conduction between the conductive films 116a and 116b can be controlled in accordance with the potential applied to the conductive film 104 or 114.

The semiconductor film 106 in the transistor 350 includes a region in contact with the conductive film 116a, a region in contact with the insulating film 310a, a region in contact with the insulating film 112, a region in contact with the insulating film 310b, and a region in contact with the conductive film 116b.

The surfaces of the conductive films 116a and 116b are oxidized or nitrided to form the insulating films 310a and 310b. The conductive films 116a and 116b may be formed of a single layer or a stacked layer of a simple substance selected from polysilicon, magnesium, aluminum, vanadium, chromium, yttrium, zirconium, niobium, neodymium, hafnium, and tantalum.

Because the transistor 350 includes the insulating films 310a, 310b, and 112 between the conductive films 114 and 116a and between the conductive films 114 and 116b, the parasitic capacitance can be reduced.

Figure 16A:
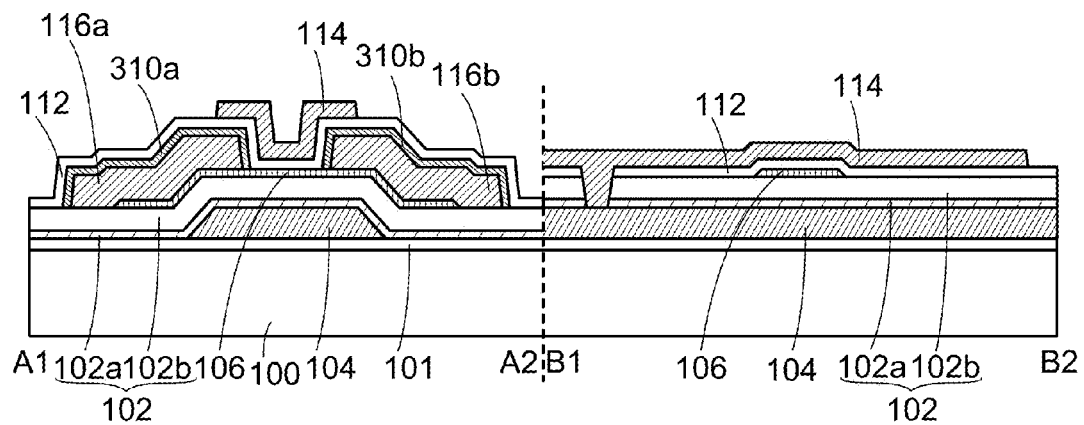
FIGS. 16A and 16B are cross-sectional views of a transistor.
Figure 16B:
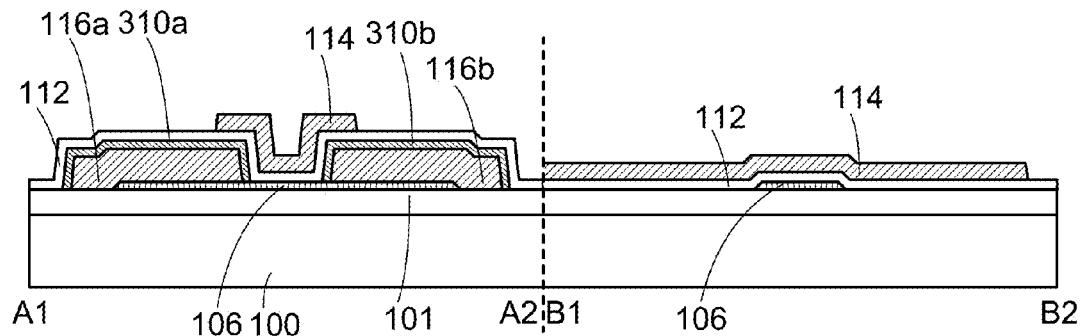

Note that the transistor 350 may have a cross-sectional structure shown in FIG. 16A or 16B. The structure in FIG. 16A is different from that in FIG. 15B in that the conductive film 114 is electrically connected to the conductive film 104. The structure in FIG. 16B is different from that in FIG. 15B in that the conductive film 104 and the insulating film 102 are not provided.

<Manufacturing Method of Transistor Structure 3>

A method for manufacturing the transistor 350 illustrated in FIGS. 15A to 15C will be described.

Figure 17A:
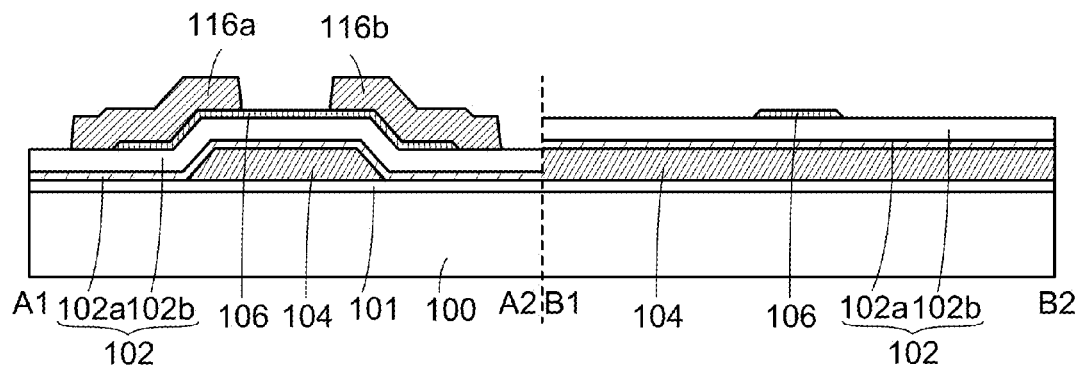
FIGS. 17A to 17C are cross-sectional views illustrating a method for manufacturing a transistor.

First, the substrate 100 is prepared. Next, the base insulating film 101 is formed. Then, a conductive film is formed and processed by a photolithography method or the like, thereby forming the conductive film 104. The insulating films 102a and 102b are then formed. A semiconductor film is formed and processed by a photolithography method or the like, thereby forming the semiconductor film 106. Next, a conductive film is formed and is processed by a photolithography method or the like, the conductive films 116a and 116b are formed thereby (see FIG. 17A). The manufacturing method of the transistor structure 1 with reference to FIGS. 9A to 9C and FIG. 10A can be referred to for the process so far.

Figure 17B:
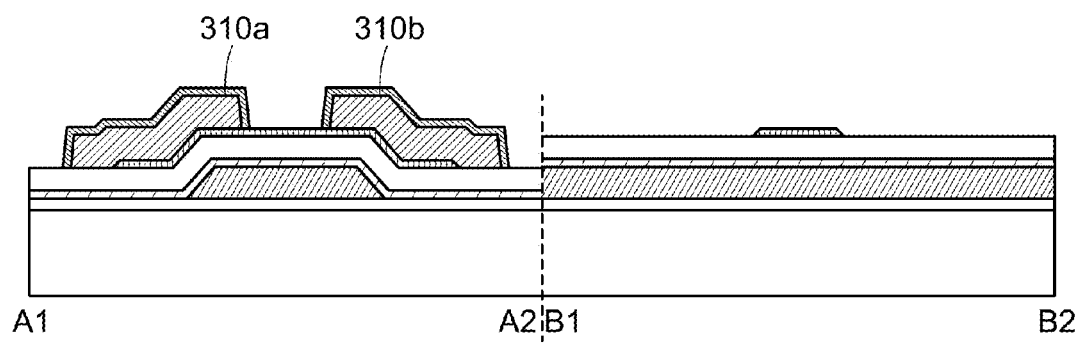

The surfaces of the conductive films 116a and 116b are oxidized or nitrided to form the insulating films 310a and 310b (see FIG. 17B). As a method for oxidizing or nitriding the surfaces of the conductive films 116a and 116b, thermal oxidation or thermal nitridation, plasma oxidation or plasma nitridation, oxygen ion implantation or nitride ion implantation, or the like can be used.

Next, an insulating film is formed by a sputtering method, a CVD method, an MBE method, an ALD method, a PLD method, or the like.

Figure 17C:
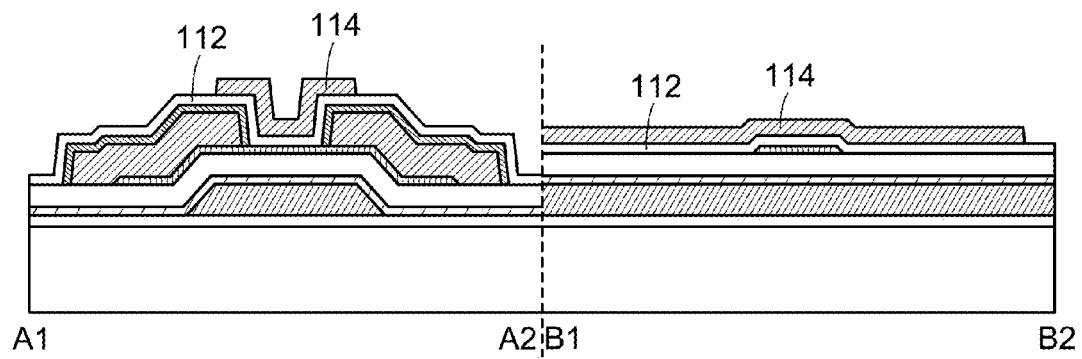

The insulating film is processed by a photolithography method or the like to form the insulating film 112 (see FIG. 17C).

Next, a conductive film is formed by a sputtering method, a CVD method, an MBE method, an ALD method, a PLD method, or the like.

The conductive film is processed by a photolithography method or the like to form the conductive film 114.

Note that the insulating film may be formed after the conductive film 114 is formed. The insulating film can be formed by a sputtering method, a CVD method, an MBE method, an ALD method, a PLD method, or the like. The second heat treatment may be performed before the insulating film is formed. Excess oxygen included in the insulating film 102 and the like moves into the semiconductor film 106 by performing the second heat treatment, whereby defects (oxygen vacancies) in the semiconductor film 106 can be reduced. Note that the second heat treatment may be performed at a temperature such that excess oxygen (oxygen) in the insulating film 102 is diffused to the semiconductor film 106. For example, the description of the first heat treatment may be referred to for the second heat treatment. The second heat treatment is preferably performed at a temperature lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of excess oxygen (oxygen) from the insulating film 102 can be inhibited. Note that the second heat treatment is not necessarily performed when heating during formation of the films can work as heat treatment comparable to the second heat treatment.

Through this process, the transistor 350 illustrated in FIGS. 15A to 15C can be fabricated.

The parasitic capacitance between the conductive films 114 and 116a and between the conductive films 114 and 116b can be small owing to the insulating films 310a and 310b in the transistor 350. The reduction in parasitic capacitance can improve operation speed of the semiconductor device. A large part of the semiconductor film 106 is made in contact with the conductive film 116a or 116b, whereby parasitic resistance can be reduced. The reduction in parasitic resistance can increase on-state current.

Note that the structures, methods, and the like described in this embodiment can be used as appropriate in combination with any of them in the other embodiments.

(Embodiment 2 )

In Embodiment 2, an example of a display device that includes any of the transistors described in the embodiment above is described below with reference to FIG. 18, FIG. 19, and FIG. 20.

Figure 18:
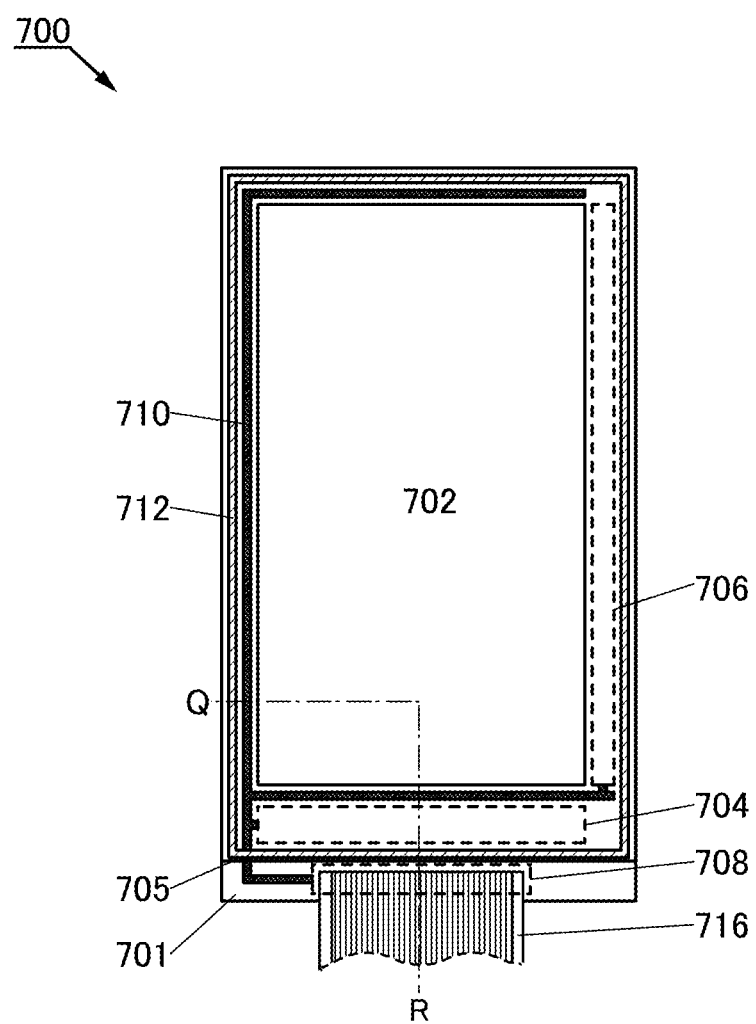
FIG. 18 is a top view illustrating one embodiment of a display device.

FIG. 18 is a top view of an example of a display device. A display device 700 illustrated in FIG. 18 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 18, a display element is provided between the first substrate 701 and the second substrate 705.

In the display device 700, a flexible printed circuit (FPC) terminal portion 708 electrically connected to the pixel portion 702, and the source driver circuit portion 704 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a wiring portion or a plurality of transistors. For the wiring portion or the plurality of transistors, any of the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, a structure including a liquid crystal element and an EL element as display elements is described with reference to FIG. 19 and FIG. 20. Note that FIG. 19 is a cross-sectional view along the dashed-dotted line Q-R shown in FIG. 18 and shows a structure including a liquid crystal element as a display element, whereas FIG. 20 is a cross-sectional view along the dashed-dotted line Q-R shown in FIG. 18 and shows a structure including an EL element as a display element.

Figure 19:
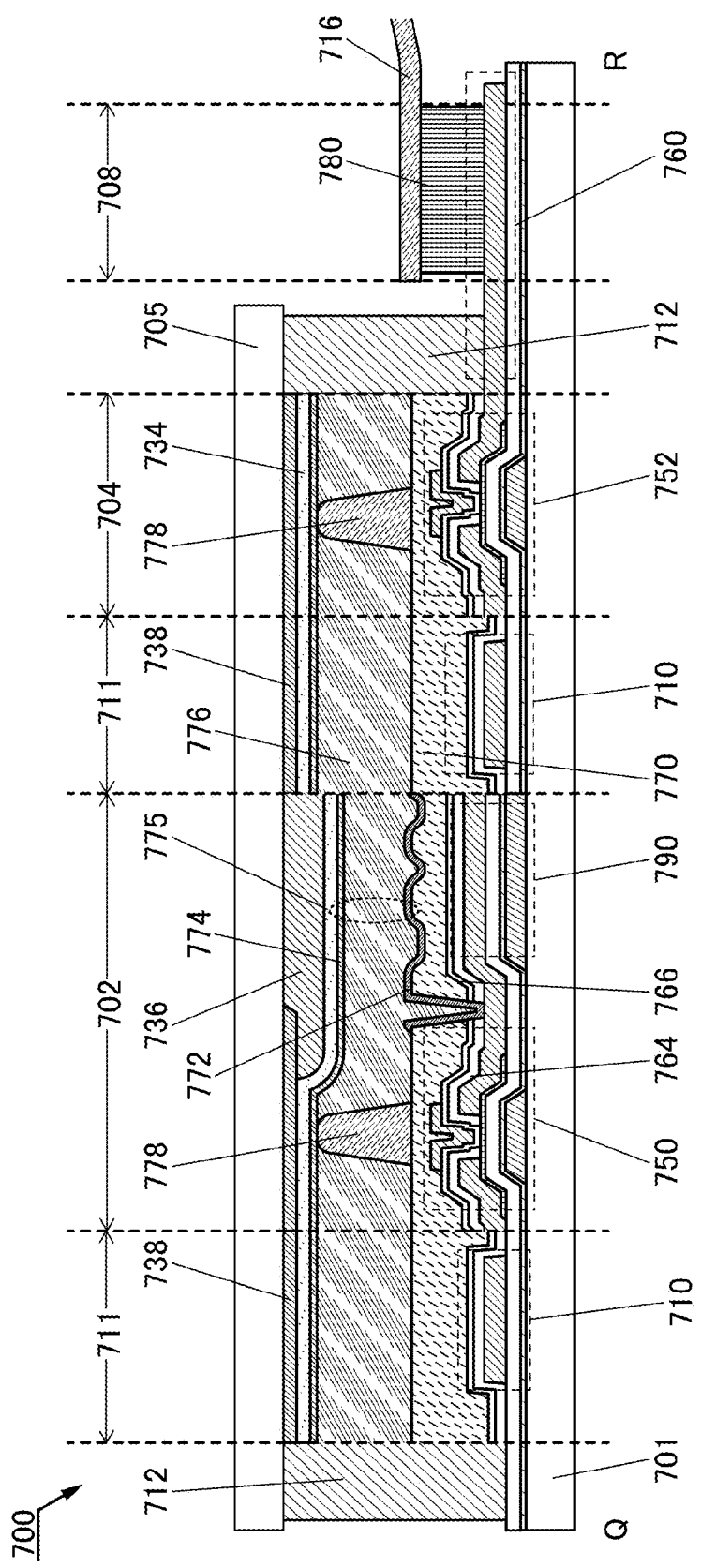
FIG. 19 is a cross-sectional view illustrating one embodiment of a display device.
Figure 20:
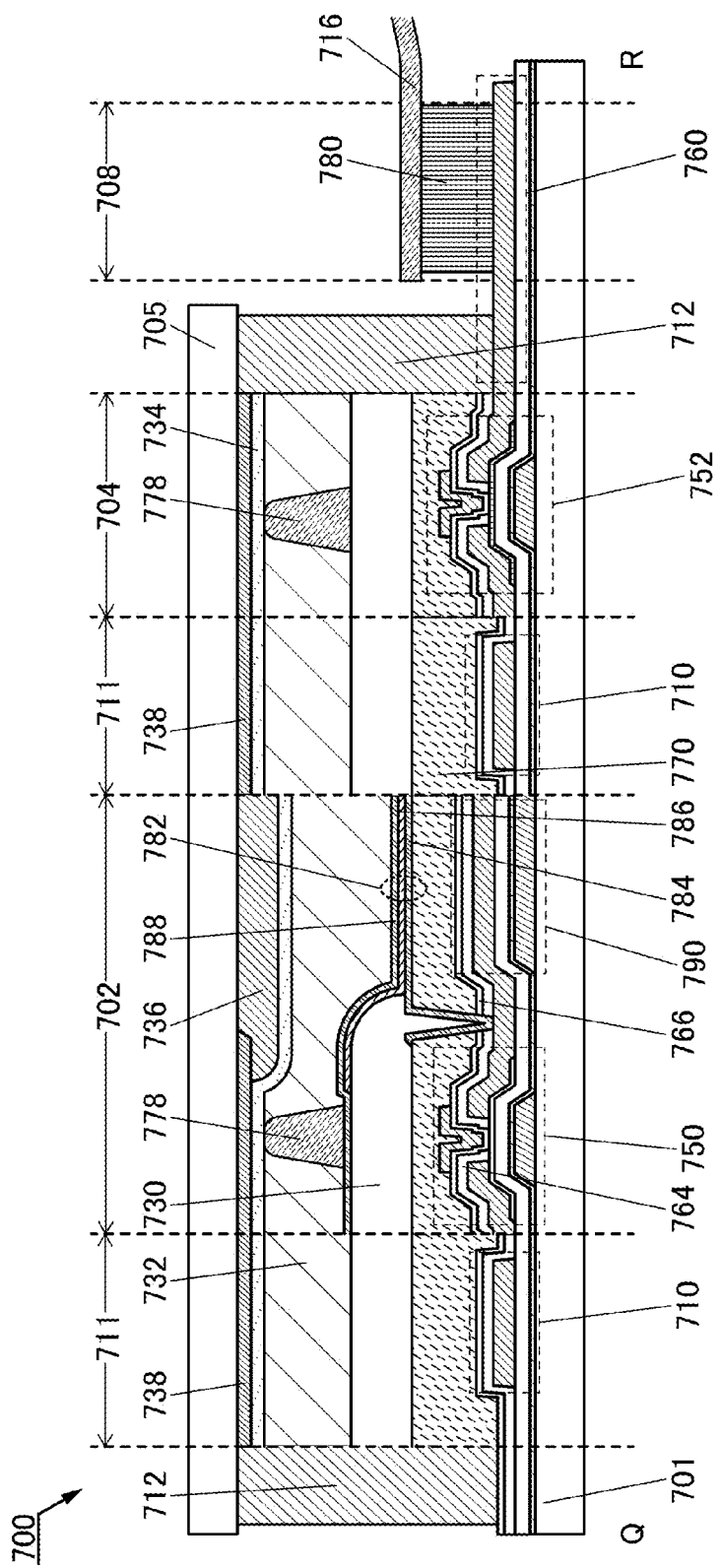
FIG. 20 is a cross-sectional view illustrating one embodiment of a display device.

Common portions between FIG. 19 and FIG. 20 are described first, and then different portions are described.
<Common Portions in Display Devices>

The display device 700 illustrated in FIG. 19 and FIG. 20 include a lead wiring portion 711, the pixel portion 702, the source driver circuit portion 704, and the FPC terminal portion 708. Note that the lead wiring portion 711 includes a signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate electrode of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 19 and FIG. 20, insulating films 764 and 766 and a planarization insulating film 770 are formed over the transistor 750, the transistor 752, and the capacitor 790.

The insulating films 764 and 766 can be formed using materials and methods similar to those of the insulating films 110*a*, 110*b*, and 112 described in the above embodiment, respectively. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film which is formed in a different process as a source electrode and a drain electrode of the transistor 750 or 752, e.g., a conductive film functioning as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 19 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 19 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display device 700 in FIG. 19 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal film that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display device 700 in FIG. 19. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 19 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 19, an alignment film may be provided on a side of the conductive film 772 in contact with the liquid crystal layer 776 and on a side of the conductive film 774 in contact with the liquid crystal layer 776. Although not illustrated in FIG. 19, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy. In addition, the liquid crystal composition which includes liquid crystal exhibiting a blue phase does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an Advanced Super View (ASV) mode, or the like can be employed.

<Display Device Using Light-Emitting Element as Display Element>

The display device 700 illustrated in FIG. 20 includes a light-emitting element 782. The light-emitting element 782 includes a conductive film 784, an EL layer 786, and a conductive film 788. The display device 700 shown in FIG. 20 is capable of displaying an image by light emission from the EL layer 786 included in the light-emitting element 782.

The conductive film 784 is connected to the conductive films functioning as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 shown in FIG. 20, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with the sealing film 732. Although a structure with the coloring film 736 is described as the display device 700 shown in FIG. 20, the structure is not limited thereto. In the case where the EL layer 786 is formed by a separate coloring method, the coloring film 736 is not necessarily provided.

The structure described in this embodiment can be used in appropriate combination with any of the structures described in the other embodiments.

(Embodiment 3)

In this embodiment, a display device that includes a semiconductor device of one embodiment of the present invention is described with reference to FIGS. 21A to 21C.

The display device illustrated in FIG. 21A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Further, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (m is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 21A:
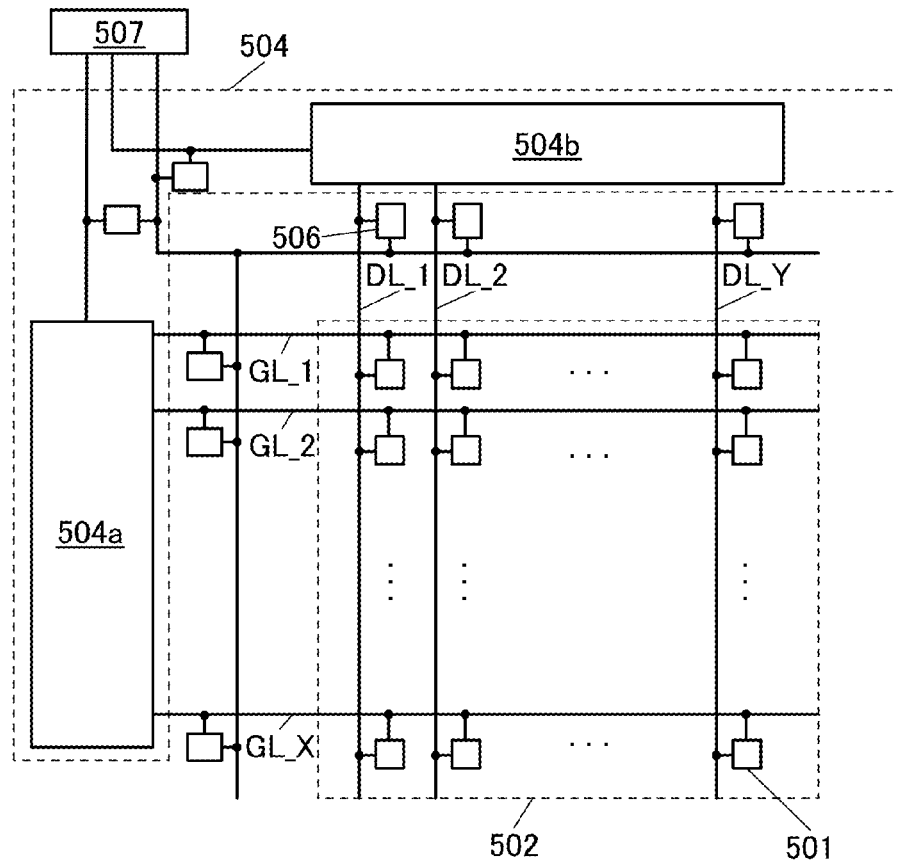
FIGS. 21A to 21C are a block diagram and circuit diagrams illustrating a display device.

The protection circuit 506 shown in FIG. 21A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 21A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504*a* or the protection circuit 506 may be configured to be connected to the source driver 504*b*. Alternatively, the protection circuit 506 may be configured to be connected to the terminal portion 507.

In FIG. 21A, an example in which the driver circuit portion 504 includes the gate driver 504*a* and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

Figure 21B:
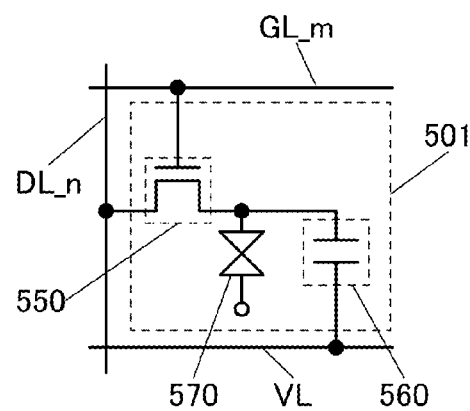

Each of the plurality of pixel circuits 501 in FIG. 21A can have the structure illustrated in FIG. 21B, for example.

The pixel circuit 501 illustrated in FIG. 21B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Further, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 21B, the pixel circuits 501 are sequentially selected row by row by the gate driver 504*a* illustrated in FIG. 21A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 21C:
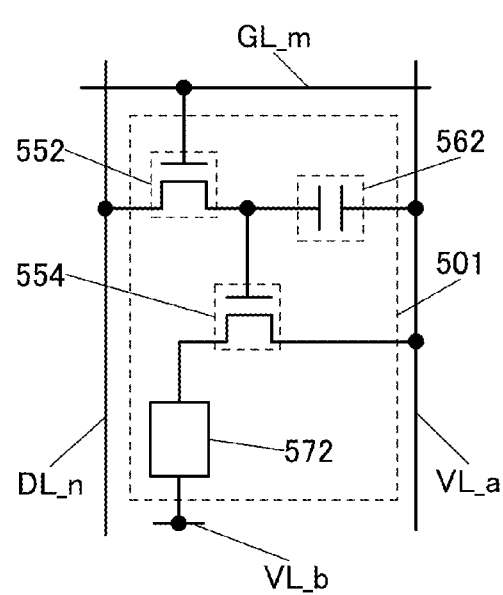

Alternatively, each of the plurality of pixel circuits 501 in FIG. 21A can have the structure illustrated in FIG. 21C, for example.

The pixel circuit 501 illustrated in FIG. 21C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Further, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 21C, the pixel circuits 501 are sequentially selected row by row by the gate driver 504a illustrated in FIG. 21A, whereby the transistors 552 are turned on and a data signal is written.

When the transistors 552 are turned off, the pixel circuits 501 in which the data has been written are brought into a holding state. Further, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be used in appropriate combination with the structure described in any of the other embodiments.

(Embodiment 4)

In this embodiment, a display module and electronic appliances that include a semiconductor device of one embodiment of the present invention are described with reference to FIG. 22 and FIGS. 23A to 23G.

Figure 22:
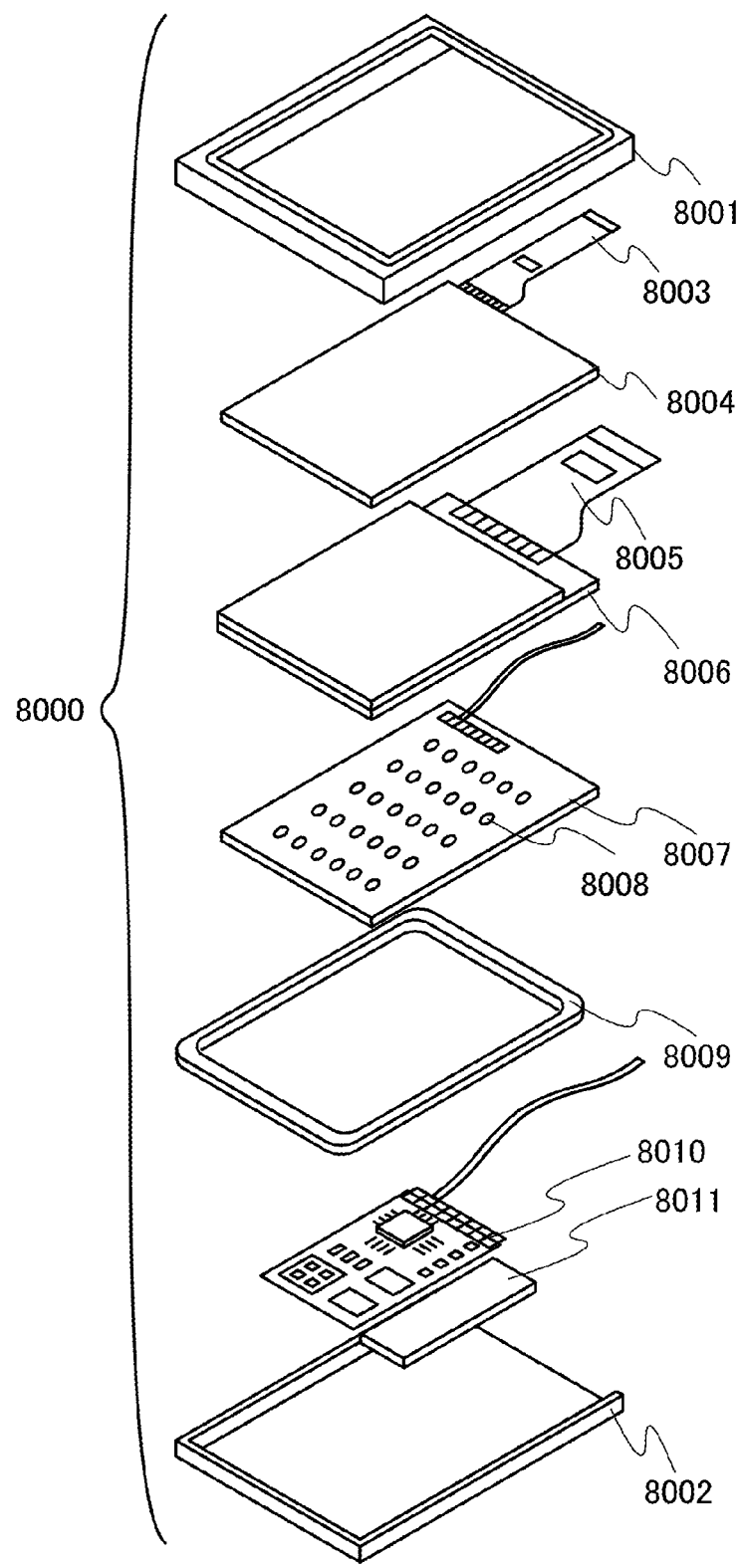
FIG. 22 is a diagram illustrating a display module.

In a display module 8000 illustrated in FIG. 22, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap the display panel 8006. A counter substrate (sealing substrate) of the display panel 8006 can have a touch panel function. A photosensor may be provided in each pixel of the display panel 8006 to form an optical touch panel.

The backlight unit 8007 includes a light source 8008. Note that although a structure in which the light sources 8008 are provided over the backlight unit 8007 is illustrated in FIG. 22, one embodiment of the present invention is not limited to this structure. For example, a structure in which the light source 8008 is provided at an end portion of the backlight unit 8007 and a light diffusion plate is further provided may be employed. Note that the backlight unit 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 23A to 23G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 23A to 23G can have a variety of functions. The electronic devices can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that the electronic devices illustrated in FIGS. 23A to 23G can have a variety of functions without limited to them. Although not shown in FIGS. 23A to 23G, the electronic device may have a plurality of display portions. The electronic device may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices shown in FIGS. 23A to 23G will be described in detail.

Figure 23A:
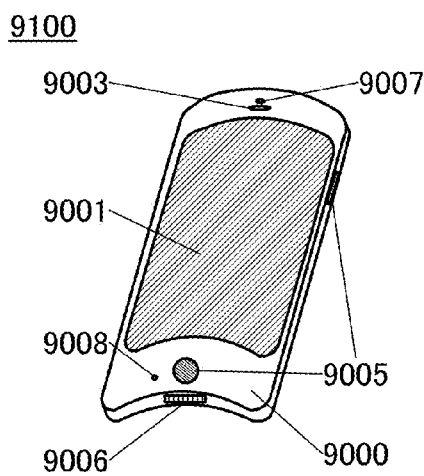
FIGS. 23A to 23G illustrate electronic devices.

FIG. 23A is a perspective view of a portable information terminal 9100. A display portion 9001 of the portable information terminal 9100 is flexible and thus can be incorporated along the curved surface of the housing 9000. In addition, the display portion 9001 includes a touch sensor, and operation can be performed by touching the screen with a finger, a stylus, or the like. For example, an icon displayed on the display portion 9001 is touched, thereby starting an application.

Figure 23D:
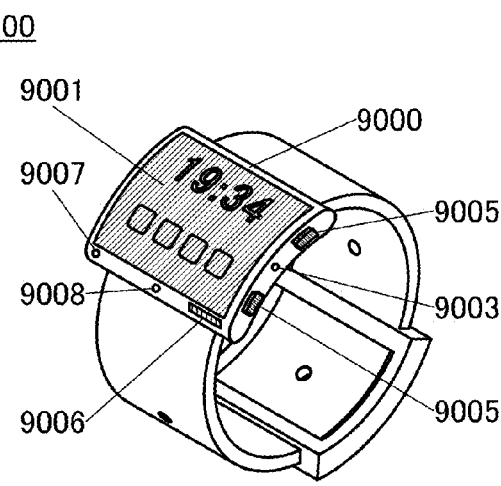
Figure 23B:
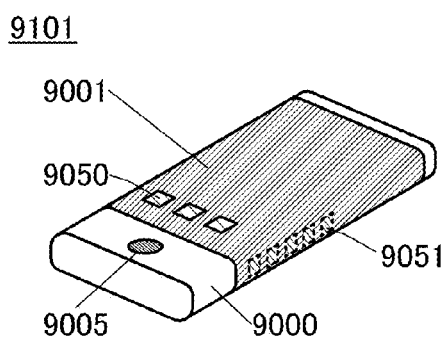

FIG. 23B is a perspective view of a portable information terminal 9101. The portable information terminal 9101 functions as, for example, one or more of a telephone set, a notebook, and an information browsing system. Specifically, it can be used as a smartphone. Note that the speaker 9003, the connection terminal 9006, the sensor 9007, and the like, which are not shown in FIG. 23B, can be positioned in the portable information terminal 9101 as in the portable information terminal 9100 shown in FIG. 23A. The portable information terminal 9101 can display characters and image information on its plurality of surfaces. For example, three operation buttons 9050 (also referred to as operation icons, or simply, icons) can be displayed on one surface of the display portions 9001. Furthermore, information 9051 indicated by dashed rectangles can be displayed on another surface. Examples of the information 9051 include notification from a social networking service (SNS), display indicating reception of an e-mail or an incoming call, the title of the e-mail, the SNS or the like, the sender of the e-mail, the SNS, or the like, the date, the time, remaining battery, and the reception strength of an antenna. Instead of the information 9051, the operation buttons 9050 or the like may be displayed on the position where the information 9051 is displayed.

Figure 23E:
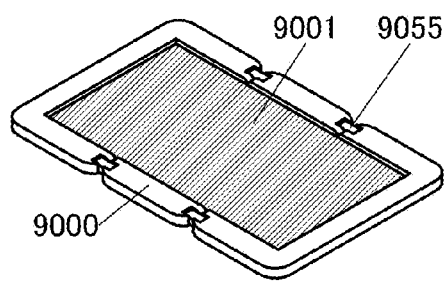
Figure 23C:
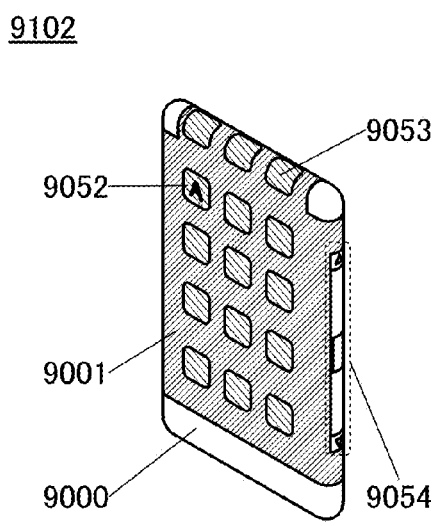

FIG. 23C is a perspective view of a portable information terminal 9102. The portable information terminal 9102 has a function of displaying information on three or more surfaces of the display portion 9001. Here, information 9052, 9053, and 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 23D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 7200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 23F:
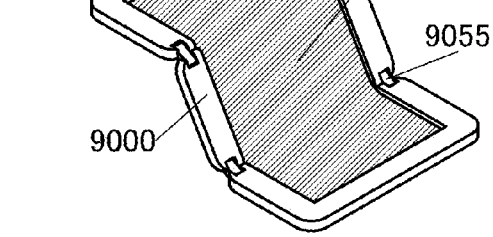
Figure 23G:
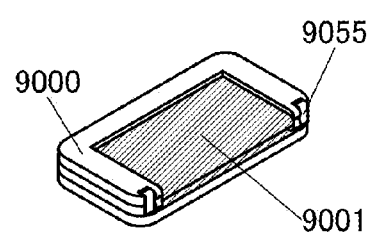

FIGS. 23E, 23F, and 23G are perspective views of a foldable portable information terminal 9201 that is opened, that is shifted from opened to folded or from folded to opened, and that is folded, respectively. The folded portable information terminal 9201 is highly portable, and the opened portable information terminal 9201 is highly browsable due to a seamless large display region. The display portion 9001 of the portable information terminal 9201 is supported by three housings joined together by hinges 9055. By folding the portable information terminal 9201 at a connection portion between two housings 9000 with the hinges 9055, the portable information terminal 9201 can be reversibly changed in shape from opened to folded. For example, the portable information terminal 9201 can be bent with a radius of curvature of greater than or equal to 1 mm and less than or equal to 150 mm.

The electronic devices described in this embodiment are characterized by having a display portion for displaying some sort of information. Note that the semiconductor device of one embodiment of the present invention can also be used for an electronic device which does not have a display portion. The display portion of the electronic device of this embodiment may be non-flexible and display on a flat surface without limitation to the flexible mode capable of displaying along the curves surface or the foldable mode.

The structure described in this embodiment can be used in appropriate combination with the structure described in any of the other embodiments.

This application is based on Japanese Patent Application serial no. 2014-091703 filed with Japan Patent Office on Apr. 25, 2014, the entire contents of which are hereby incorporated by reference.

What is claimed is:

1. A semiconductor device comprising:
   a first oxide semiconductor film;
   a first conductive film over and in contact with the first oxide semiconductor film;
   a second conductive film over and in contact with the first oxide semiconductor film;
   a first insulating film over and in contact with the first conductive film and a first region of the first oxide semiconductor film;
   a second insulating film over and in contact with the second conductive film and a second region of the first oxide semiconductor film;
   a second oxide semiconductor film over and in contact with each of the first insulating film, the second insulating film and the first oxide semiconductor film;
   a third insulating film overlapping with each of a third region of the first oxide semiconductor film, the first insulating film and the second insulating film with the second oxide semiconductor film interposed therebetween; and
   a third conductive film overlapping with the third region of the first oxide semiconductor film with the third insulating film and the second oxide semiconductor film provided therebetween,
   wherein the third region is between the first region and the second region.

2. The semiconductor device according to claim 1, further comprising:
   a fourth conductive film; and
   a fourth insulating film over the fourth conductive film,
   wherein the third conductive film overlaps with the forth conductive film with the third insulating film, the third region of the first oxide semiconductor film and the fourth insulating film provided therebetween.

3. The semiconductor device according to claim 1,
   wherein the first insulating film is in contact with a top surface and side surfaces of the first conductive film, and wherein the second insulating film is in contact with a top surface and side surfaces of the second conductive film.

4. The semiconductor device according to claim 1, further comprising a third oxide semiconductor film under the first oxide semiconductor film.

5. The semiconductor device according to claim 1,
wherein the first insulating film comprises a nitride or an oxide of a material of the first conductive film, and
wherein the second insulating film comprises a nitride or an oxide of a material of the second conductive film.

6. An electronic device comprising the semiconductor device according to claim 1.

7. A semiconductor device comprising:
a first oxide semiconductor film comprising a channel formation region;
a first conductive film over and in contact with the first oxide semiconductor film;
a second conductive film over and in contact with the first oxide semiconductor film;
a first insulating film over and in contact with the first conductive film and a first region of the first oxide semiconductor film;
a second insulating film over and in contact with the second conductive film and a second region of the first oxide semiconductor film;
a second oxide semiconductor film over and in contact with each of the first insulating film, the second insulating film and the first oxide semiconductor film;
a third insulating film overlapping with each of the channel formation region of the first oxide semiconductor film, the first insulating film and the second insulating film with the second oxide semiconductor film interposed therebetween; and
a third conductive film overlapping with the channel formation region with the third insulating film provided therebetween,
wherein resistance of the first region and the second region of the first oxide semiconductor film is lower than resistance of the channel formation region, and
wherein the channel formation region is between the first region and the second region.

8. The semiconductor device according to claim 7, further comprising:
a fourth conductive film; and
a fourth insulating film over the fourth conductive film,
wherein the third conductive film overlaps with the forth conductive film with the third insulating film, the channel formation region and the fourth insulating film provided therebetween.

9. The semiconductor device according to claim 8,
wherein each of the first insulating film and the second insulating film comprises a nitride insulating film containing hydrogen, and
wherein each of the third insulating film and the fourth insulating film comprises an oxide insulating film.

10. The semiconductor device according to claim 7,
wherein the first region and the second region of the first oxide semiconductor film contain hydrogen.

11. The semiconductor device according to claim 7,
wherein the first insulating film is in contact with a top surface and side surfaces of the first conductive film, and
wherein the second insulating film is in contact with a top surface and side surfaces of the second conductive film.

12. The semiconductor device according to claim 7, further comprising a third oxide semiconductor film under the first oxide semiconductor film.

13. An electronic device comprising the semiconductor device according to claim 7.

14. A manufacturing method of a semiconductor device comprising the steps of:
forming a first insulating film;
forming an oxide semiconductor film over the first insulating film;
forming a first conductive film and a second conductive film over and in contact with the oxide semiconductor film;
depositing a second insulating film over and in contact with a top surface of each of the oxide semiconductor film, the first conductive film, and the second conductive film;
processing the second insulating film so as to form a third insulating film over and in contact with the top surface of the first conductive film and a fourth insulating film over and in contact with the top surface of the second conductive film;
forming a fifth insulating film over the oxide semiconductor film, the third insulating film, and the fourth insulating film; and
forming a third conductive film over the fifth insulating film,
wherein the third insulating film is in contact with a first region of the oxide semiconductor film and the fourth insulating film is in contact with a second region of the oxide semiconductor film,
wherein the fifth insulating film is in contact with a third region of the oxide semiconductor film which is between the first region and the second region, and
wherein the third conductive film overlaps with the third region of the oxide semiconductor film with the fifth insulating film provided therebetween.

15. The manufacturing method of a semiconductor device according to claim 14, further comprising the steps of:
forming a fourth conductive film before forming the first insulating film,
wherein the third conductive film overlaps the fourth conductive film with the first insulating film, the third region of the oxide semiconductor film and the fifth insulating film provided therebetween.

* * * * *

UNITED STATES PATENT AND TRADEMARK OFFICE
CERTIFICATE OF CORRECTION

PATENT NO. : 9,780,226 B2
APPLICATION NO. : 14/685737
DATED : October 3, 2017
INVENTOR(S) : Junichi Koezuka et al.

It is certified that error appears in the above-identified patent and that said Letters Patent is hereby corrected as shown below:

In the Claims

Column 41, Line 35, Claim 7, "third insulating film provided therebetween" should read --third insulating film and the second oxide semiconductor film provided therebetween--

Signed and Sealed this
Twenty-third Day of January, 2018

Joseph Matal
*Performing the Functions and Duties of the*
*Under Secretary of Commerce for Intellectual Property and*
*Director of the United States Patent and Trademark Office*